US010210930B2

(12) United States Patent
Nakayama et al.

(10) Patent No.: US 10,210,930 B2
(45) Date of Patent: Feb. 19, 2019

(54) NONVOLATILE SEMICONDUCTOR STORAGE APPARATUS

(71) Applicant: Panasonic Intellectual Property Management Co., Ltd., Osaka (JP)

(72) Inventors: Masayoshi Nakayama, Kyoto (JP); Yasuo Murakuki, Kyoto (JP); Takafumi Maruyama, Hiroshima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/219,232

(22) Filed: Jul. 25, 2016

(65) Prior Publication Data

US 2016/0372191 A1 Dec. 22, 2016

Related U.S. Application Data

(63) Continuation of application No. PCT/JP2015/000754, filed on Feb. 18, 2015.

(30) Foreign Application Priority Data

Feb. 20, 2014 (JP) ................. 2014-030309

(51) Int. Cl.
*G11C 13/00* (2006.01)
*G11C 7/06* (2006.01)
(Continued)

(52) U.S. Cl.
CPC ............ *G11C 13/004* (2013.01); *G11C 7/065* (2013.01); *G11C 11/1673* (2013.01);
(Continued)

(58) Field of Classification Search
CPC ................. G11C 2013/0054; G11C 13/0064
(Continued)

(56) References Cited

U.S. PATENT DOCUMENTS 5,847,995 A * 12/1998 Kobayashi ............ G11C 29/78
365/185.11
5,859,798 A * 1/1999 Yero ...................... G11C 16/28
365/149
(Continued)

FOREIGN PATENT DOCUMENTS

JP 2005-322352 A 11/2005
JP 2008-276828 11/2008
(Continued)

OTHER PUBLICATIONS

International Search Report of PCT application No. PCT/JP2015/000754 dated Apr. 14, 2015.

*Primary Examiner* — Hoai V Ho
*Assistant Examiner* — Jay Radke
(74) *Attorney, Agent, or Firm* — McDermott Will & Emery LLP

(57) ABSTRACT

A nonvolatile semiconductor storage apparatus is provided. To a data node and a reference node, a first transistor and a second transistor are respectively connected. In a data state determining operation, in the case where voltage is applied to the data node and reference node, the first and second transistors operate as precharge transistors in a first operation mode, and operate as mirror transistors in a second operation mode. The first and second operation modes are switched.

12 Claims, 26 Drawing Sheets

(51) Int. Cl.
*G11C 11/16* (2006.01)
*G11C 16/28* (2006.01)
(52) U.S. Cl.
CPC ...... *G11C 13/0002* (2013.01); *G11C 13/0064* (2013.01); *G11C 16/28* (2013.01); *G11C 2013/0054* (2013.01); *G11C 2213/79* (2013.01)
(58) Field of Classification Search
USPC ................ 365/148, 203, 210.12, 189.15
See application file for complete search history.

(56) References Cited

U.S. PATENT DOCUMENTS

| | | | | |
|---|---|---|---|---|
| 5,917,753 | A | * | 6/1999 | Dallabora ............... G11C 7/062 |
| | | | | 365/185.2 |
| 2005/0254294 | A1 | | 11/2005 | Iwata |
| 2009/0303785 | A1 | | 12/2009 | Hwang et al. |
| 2011/0110142 | A1 | | 5/2011 | Kitagawa et al. |
| 2011/0116296 | A1 | | 5/2011 | Kitagawa et al. |
| 2011/0199812 | A1 | | 8/2011 | Kitagawa et al. |
| 2012/0212994 | A1 | * | 8/2012 | Tsushima ............... H01L 27/101 |
| | | | | 365/148 |
| 2013/0148429 | A1 | * | 6/2013 | Kim ...................... G11C 7/222 |
| | | | | 365/185.18 |
| 2014/0063923 | A1 | * | 3/2014 | Jefremow ........... G11C 11/1673 |
| | | | | 365/158 |
| 2015/0070972 | A1 | * | 3/2015 | Kitagawa ............ G11C 13/004 |
| | | | | 365/148 |

FOREIGN PATENT DOCUMENTS

| | | |
|---|---|---|
| JP | 2009-295264 | 12/2009 |
| JP | 2011-103155 | 5/2011 |
| JP | 2011-108311 | 6/2011 |
| JP | 2011-165297 | 8/2011 |

\* cited by examiner

NONVOLATILE SEMICONDUCTOR STORAGE APPARATUS

BACKGROUND

1. Technical Field

The present disclosure relates to a nonvolatile semiconductor storage apparatus including a readout circuit that determines data by detecting current that flows when voltage is applied to opposite ends of a memory cell, and to a readout circuit capable of stably determining data even with determination current which differs between a readout operation and a verify operation which is a readout operation for determining rewrite.

2. Description of the Related Art

In recent years, in accordance with growing demands for electronic devices, particularly mobile phones (smartphones), mobile music players, digital cameras, tablet terminals and the like, demands for nonvolatile semiconductor storage apparatuses have also been growing. Technical developments for increasing the capacity, reducing the size, and realizing fast rewrite, fast readout, and operations with reduced power consumption are actively proceeding.

Current mainstream nonvolatile memory is flash memory whose rewrite time is of the order of microseconds or milliseconds, which hinders an improvement in the performance of a device equipped with the nonvolatile memory.

Recently, novel nonvolatile memory capable of achieving rewrite operations at higher speeds and with smaller power consumption as compared to flash memory has been actively developed. Such a memory includes resistive random access memory (ReRAM) using a variable resistance element as a storage element.

There has been provided, as a readout circuit that determines a data state of a memory cell of a nonvolatile semiconductor storage apparatus such as a ReRAM, a method of determining data by: precharging a determining node to supply voltage; and thereafter discharging the determining node through a memory cell while amplifying the voltage difference between voltage of the determining node, which is generated according to a current amount flowing through the memory cell, and the reference voltage to a logic level. Since this method operates relatively at low voltage and high speeds, it is employed as a readout circuit of a nonvolatile semiconductor storage apparatus.

However, with ReRAM, in order to certify the resistance characteristic and ensure the data retaining characteristic after rewrite, a verify operation may be performed. The verify operation is an operation of determining a low resistance state or a high resistance state after a rewrite write operation.

In this case, a determining resistance in a readout operation differs from a determining resistance in a verify operation. Accordingly, in the case where the above-described readout circuit is used in all the readout operation and the verify operation, the voltage transition at the determining node in discharging differs depending on the operation mode. Hence, the timing of amplifying the voltage difference needs to be optimized in each mode. On the other hand, there is a problem that it is difficult to design such a timing generator circuit.

Addressing the problem, there is provided a structure in which a mirror circuit is added separately from a precharging circuit for the determining node, and the operating circuit is switched between a readout operation and a verify operation so that the amplifying timing becomes substantially identical irrespective of the operation mode (PTL 1).

However, such a structure newly necessitates the mirror circuit, and therefore has a problem of an increase in the circuit area.

In addition, there have been proposed a structure using a replica circuit as the timing generator circuit (PTL 2) and a structure in which capacity load of the determining node is switched according to the operation mode so that an operation at constant amplifying timing is realized irrespective of the operation mode (PTL 3). However, such structures necessitate complicated circuitry, and are associated with problems such as an increase in the circuit scale and impairment of high speeds in a readout operation.

CITATION LIST

Patent Literatures

PTL 1: Unexamined Japanese Patent Publication No. 2011-165297

PTL 2: Unexamined Japanese Patent Publication No. 2011-103155

PTL 3: Unexamined Japanese Patent Publication No. 2011-108311

SUMMARY

The present disclosure has been made in view of the problems described above, and relates to a nonvolatile semiconductor storage apparatus including a readout circuit that determines data by detecting current that flows when voltage is applied to opposite ends of a memory cell. An object of the present disclosure is to provide a nonvolatile semiconductor storage apparatus equipped with a readout circuit whose high speeds and determining precision of a readout operation are not impaired and an increase in the circuit scale is not increased even with determination current which differs between a readout operation and a verify operation.

In order to solve the problems, the present disclosure provides the following solution means.

A nonvolatile semiconductor storage apparatus of the present disclosure includes a memory cell, a reference cell, a readout circuit, a first transistor, a second transistor, and a switch.

The reference cell includes a memory cell that includes at least first and second terminals, and at least third and fourth terminals. The readout circuit is connected to the first terminal and the third terminal. The first transistor is connected to the first terminal. The second transistor is connected to the third terminal. A gate of the first transistor and a gate of the second transistor are connected in common. The switch electrically short-circuits and disconnects between the gates of the first and second transistors and the third terminal or the fourth terminal.

Thus, substantially identical amplifying timing can be realized between a readout operation and verify operation, and both high speeds and determining precision of a readout operation are achieved with a simpler circuit structure. Further, by virtue of a reduced bit line application voltage in an LR verify operation, a nonvolatile semiconductor storage apparatus with reduced current consumption can be provided.

DETAILED DESCRIPTION

In the following, a description will be given of exemplary embodiments of the present disclosure with reference to the drawings.

First Exemplary Embodiment

Figure 1:
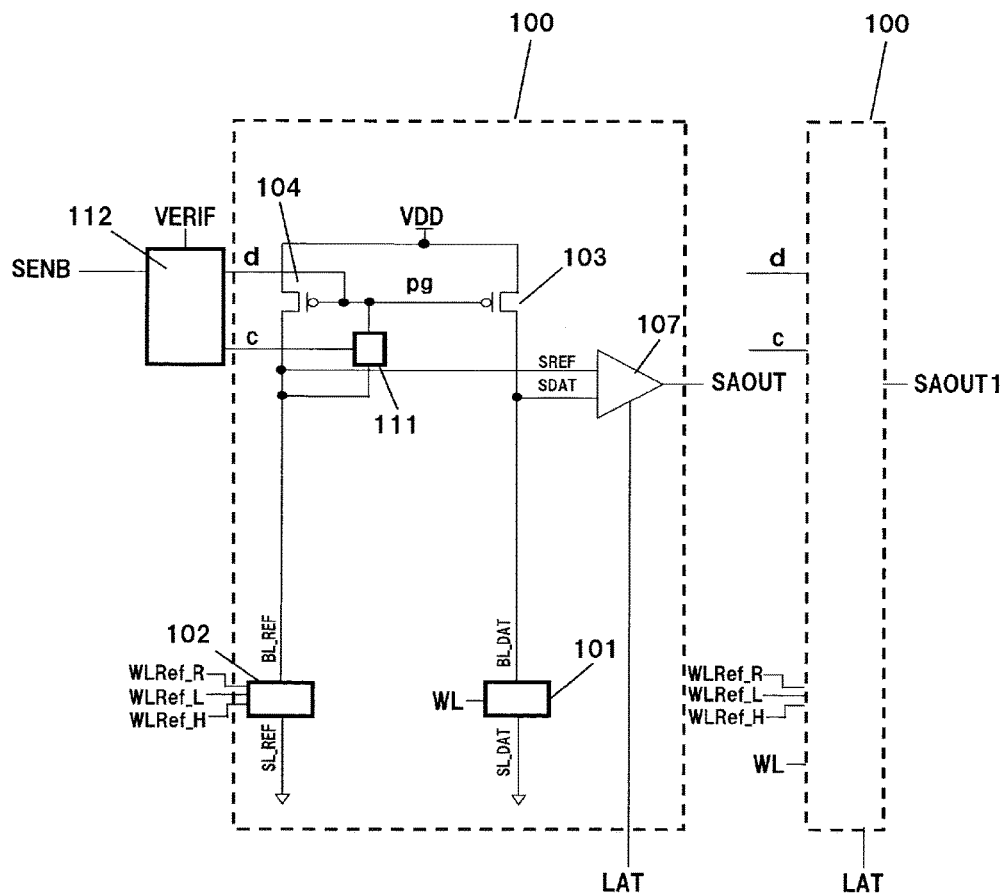
FIG. 1 is a circuit diagram of a nonvolatile semiconductor storage apparatus according to a first exemplary embodiment of the present disclosure.

FIGS. 1 to 8 show the structure of a first exemplary embodiment of the present disclosure. FIG. 1 is a circuit diagram of a nonvolatile semiconductor storage apparatus according to the first exemplary embodiment of the present disclosure. Reference character 100 denotes a readout unit of 1-bit data of the nonvolatile semiconductor storage apparatus, which is arranged by 16 pieces for 16-bit data, with control signals and the like connected in common among the readout units. Reference character 101 denotes a memory cell (variable resistance nonvolatile memory cell). While FIG. 1 shows the case where single memory cell 101 is disposed for the sake of simplicity, the operation described below holds true for the case where a plurality of memory cells are disposed.

Reference character 102 denotes a reference cell. Reference characters 103 and 104 denote P-type metal-oxide-semiconductor (PMOS) transistors for applying supply voltage VDD to data node SDAT being a determining node and reference node SREF. Reference character 111 denotes a switch circuit between pg and SREF. Determining circuit 107 is a determining circuit including an amplifier that amplifies the voltage difference between SDAT and SREF to a logic level and performs latching. Reference character 112 denotes a control circuit that outputs control signals c, d for readout unit 100 in response to VERIF, SENB signals.

Figure 2:
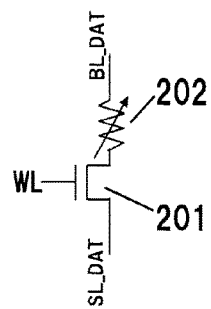
FIG. 2 is a circuit diagram of a memory cell using a variable resistance element according to the first exemplary embodiment of the present disclosure.
Figure 3:
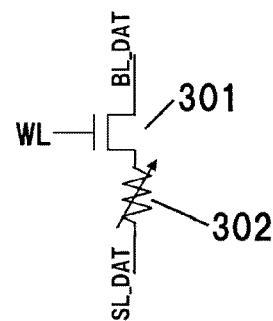
FIG. 3 is a circuit diagram of another memory cell using the variable resistance element according to the first exemplary embodiment of the present disclosure.

FIG. 2 is a circuit diagram of the memory cell using the variable resistance element according to the first exemplary embodiment of the present disclosure. FIG. 2 shows an exemplary structure of memory cell 101. Memory cell 101 includes one N-type metal-oxide-semiconductor (NMOS) selective element 201 and nonvolatile variable resistance element 202, and is of the type in which the nonvolatile variable resistance element is connected to a bit line. Here, the nonvolatile variable resistance element is connected to BL_DAT. The other element of the memory cell is connected to a ground power supply. FIG. 3 is a circuit diagram of another memory cell using the variable resistance element according to the first exemplary embodiment of the present disclosure. FIG. 3 shows an exemplary structure of memory cell 101 of another type. Memory cell 101 of FIG. 3 includes one NMOS selective element 301 and nonvolatile variable resistance element 302, and is of the type in which the selective element is connected to a bit line. Here, the selective element is connected to BL_DAT. The other element of the memory cell is connected to a ground power supply. In each memory cell, the selective element may be a diode.

Figure 4:
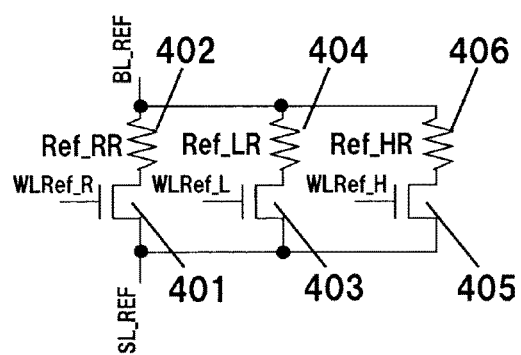
FIG. 4 is a circuit diagram of a reference cell according to the first exemplary embodiment of the present disclosure.

FIG. 4 is a circuit diagram of the reference cell according to the first exemplary embodiment of the present disclosure. FIG. 4 shows an exemplary structure of reference cell 102. Reference cell 102 includes three NMOS selective elements (401, 403, 405) and three fixed resistor elements (402: Ref_RR, 404: Ref_LR, 406: Ref_HR), and is of the type in which the fixed resistor elements are connected to a bit line. Here, the fixed resistor elements are connected to BL_REF. Ref_RR is a fixed resistor element selected in a readout operation. Ref_LR is a fixed resistor element selected in a verify operation of the memory cell in a low resistance state. Ref_HR is a fixed resistor element selected in a verify operation of the memory cell in a high resistance state. The fixed resistor elements (Ref_RR, Ref_LR, Ref_HR) are, for example, each made of a polysilicon film, and the resistance value is adjusted by the width and length of the film.

Figure 5:
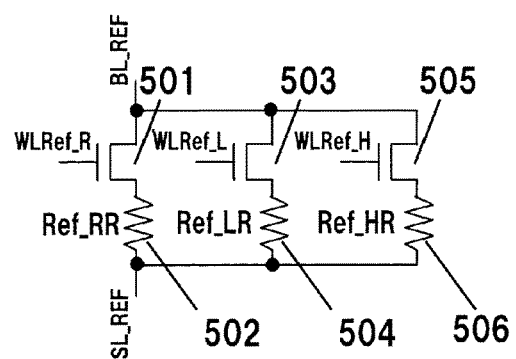
FIG. 5 is a circuit diagram of another reference cell according to the first exemplary embodiment of the present disclosure.

Their respective resistance values satisfy the relationship: Ref_LR<Ref_RR<Ref_HR. FIG. 5 is a circuit diagram of another reference cell according to the first exemplary embodiment of the present disclosure. The reference cell of FIG. 5 includes three NMOS selective elements (501, 503, 505) and three fixed resistor elements (502: Ref_RR, 504: Ref_LR, 506: Ref_HR), and is of the type in which the selective elements are connected to a bit line. Similarly to memory cell 101, the structure of reference cell 102 may be as shown in FIG. 5, and the selective elements may be diodes.

As one mode of the nonvolatile semiconductor storage apparatus of the present disclosure, the reference cell may include at least two resistors having one ends connected in parallel to a third terminal or a fourth terminal. The other ends of the resistors may be electrically connected to the fourth terminal when the one ends of the resistors are connected to the third terminal, or to the third terminal when the one ends of the resistors are connected to the fourth terminal, according to the first operation mode or the second operation mode.

Figure 6:
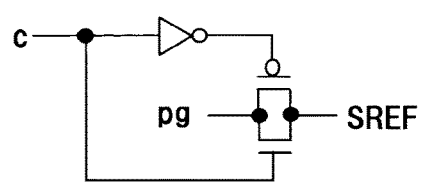
FIG. 6 is a circuit diagram of a switch circuit according to the first exemplary embodiment of the present disclosure.

FIG. 6 is a circuit diagram of a switch circuit according to the first exemplary embodiment of the present disclosure. FIG. 6 shows the structure of switch circuit 111. In response to control signal c, switch circuit 111 short-circuits or disconnects between pg and SREF.

Figure 7:
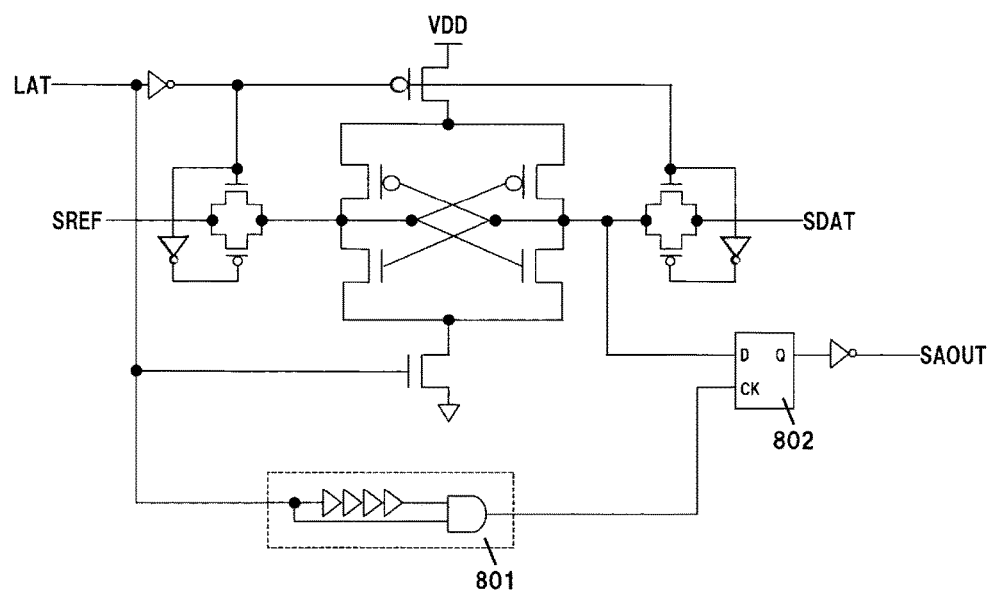
FIG. 7 is a circuit diagram of a determining circuit according to the first exemplary embodiment of the present disclosure.

FIG. 7 is a circuit diagram of a determining circuit according to the first exemplary embodiment of the present disclosure. FIG. 7 shows the structure of determining circuit 107. SDAT and SREF are input to a cross-coupled complementary metal oxide semiconductor (CMOS) differential amplifier circuit, and latch signal LAT is at a logic 'high' level (hereinafter referred to as 'H' level). Thus, the voltage difference between SDAT and SREF is amplified to a logic level, and input to latch circuit 802 by an output signal of delay circuit 801 that delays LAT, to be output as sense amplifier output SAOUT.

Figure 8:
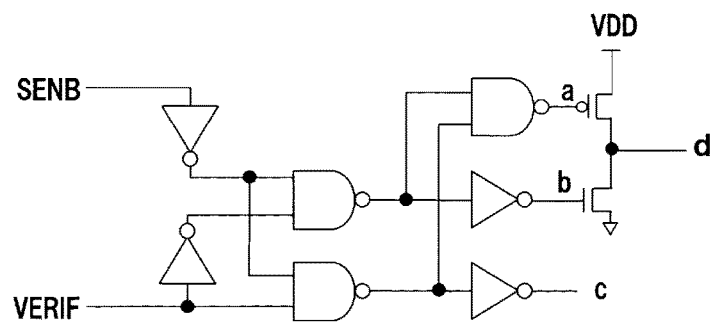
FIG. 8 is a circuit diagram of a control circuit according to the first exemplary embodiment of the present disclosure.

FIG. 8 is a circuit diagram of a control circuit according to the first exemplary embodiment of the present disclosure. FIG. 8 shows the structure of control circuit 112. Control circuit 112 outputs control signals c, d in response to SENB, VERIF signals. Control signal c is connected to switch circuit 111, and control signal d is connected to gates of PMOS transistors 103, 104. As one mode of the nonvolatile semiconductor storage apparatus of the present disclosure, a first control terminal may be connected to the gate of a first transistor, and a second control terminal that controls short-circuiting and disconnection of the switch may be connected to the switch. Control over the first and second control terminals may be switched.

Figure 9:
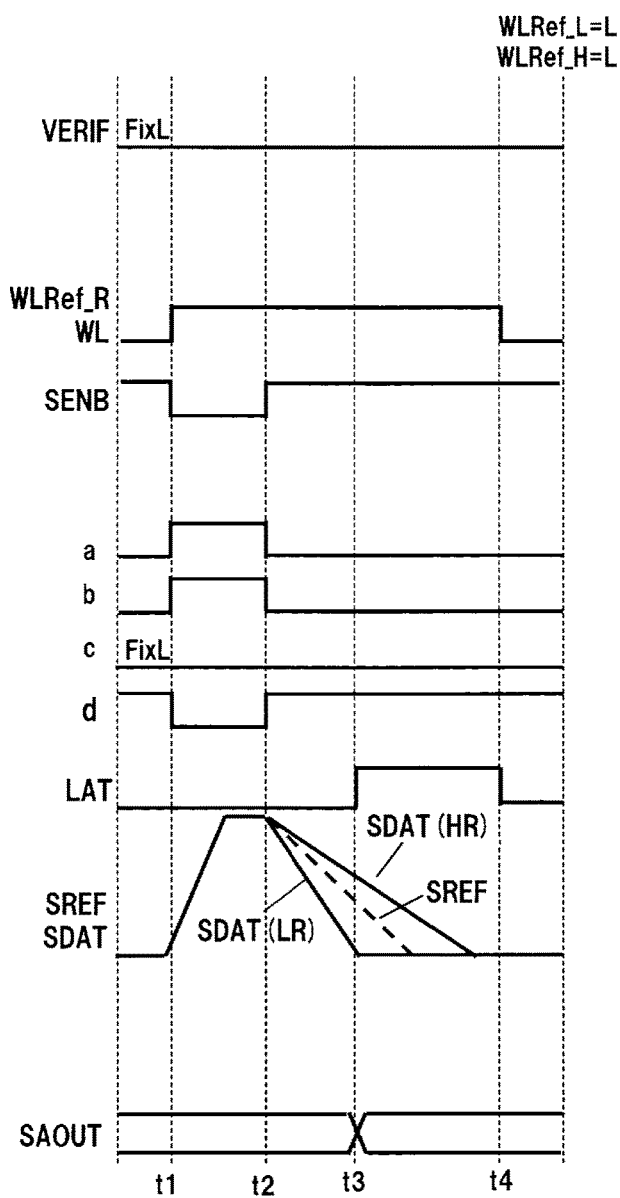
FIG. 9 is a chart showing readout operation waveforms using the nonvolatile semiconductor storage apparatus according to the first exemplary embodiment of the present disclosure.

Next, a description will be given of a readout operation. FIG. 9 is a chart showing readout operation waveforms using the nonvolatile semiconductor storage apparatus according to the first exemplary embodiment of the present disclosure. VERIF is set to a logic 'low' level (hereinafter referred to as 'L' level), and WLRef_L, WLRef_H are set to non-selection level (herein 'L' level).

At time point t1, WLRef_R and WL are caused to transit to selection level (herein, 'H' level), and SENB is set to 'L' level. Thus, control signals a, b transit to 'H' level and control signal d transits to 'L' level, and PMOS transistors 103, 104 operate as precharge transistors and start precharging SDAT, SREF. At this time, control signal c is fixed to 'L' level.

At time point t2, SENB transits to 'H' level, control signals a, b transit to 'L' level, control signal d transits to 'H' level, and the precharging is stopped. At this time, SDAT, SREF are substantially at VDD level.

In a period from time point t2 to time point t3, through memory cell 101 and reference cell 102, SDAT, SREF and BL_DAT, BL_REF are discharged.

When the memory cell is in a low resistance state (LR), SDAT voltage reduces faster than SREF voltage.

When the memory cell is in a high resistance state (HR), SDAT voltage reduces slower than SREF voltage.

Time point t3 is set to the timing at which the voltage difference between SDAT and SREF becomes greater than the amplification limit voltage of the amplifier of determining circuit 107. At time point t3, LAT is set to 'H' level, whereby the amplifier is activated and data is output to SAOUT.

At time point t4, WL, WLRef_R are set to non-selection level and LAT is set to 'L' level, whereby the amplifier is stopped.

Figure 10:
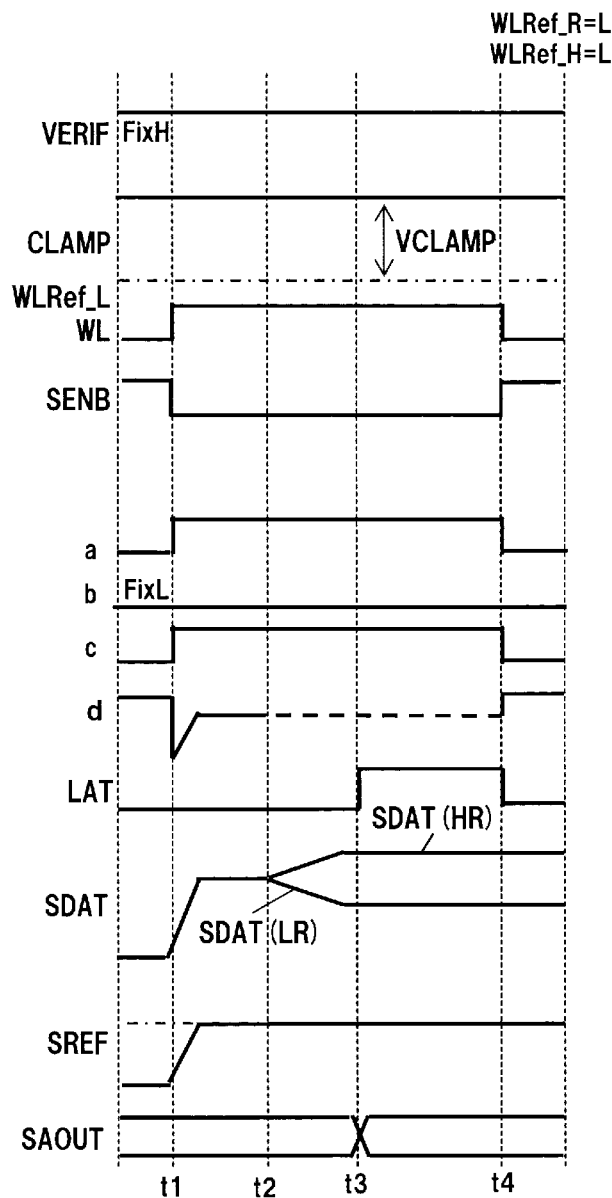
FIG. 10 is a chart showing LR verify operation waveforms using the nonvolatile semiconductor storage apparatus according to the first exemplary embodiment of the present disclosure.

Next, a description will be given of a reduced resistance verifying operation (hereinafter referred to as an LR verify operation), which is a readout operation of verifying the resistance value after a resistance reducing operation. FIG. 10 is a chart showing LR verify operation waveforms using the nonvolatile semiconductor storage apparatus according to the first exemplary embodiment of the present disclosure. VERIF is set to 'H' level, and WLRef_R, WLRef_H are set to non-selection level.

At time point t1, WLRef_L and WL are caused to transit to selection level and SENB is set to 'L' level, whereby control signals a, c transit to 'H' level and control signal d attains high impedance. By switch circuit 111, in a period from time point t1 to time point t2, gate pg of PMOS transistors 103, 104 attains a voltage identical to SREF. This causes PMOS transistors 103, 104 to operate as mirror transistors, and charge SDAT, SREF, BL_DAT, BL_REF to a certain voltage. At this time, control signal b is fixed to 'L' level.

At time point t2, SDAT, SREF, BL_DAT, BL_REF are at a certain voltage level determined by the operating point.

In a period from time point t2 to time point t3, PMOS transistors 103, 104 operate as mirror transistors. Thus, since current passes through memory cell 101 and reference cell 102 by substantially the same amount, the voltage difference between SDAT and SREF results from the resistance difference between the memory cell and the reference cell.

When the memory cell is in the low resistance state (LR), SDAT voltage becomes lower than SREF voltage.

When the memory cell is in the high resistance state (HR), SDAT voltage becomes higher than SREF voltage.

Time point t3 is set to the timing at which the voltage difference between SDAT and SREF becomes greater than the amplification limit voltage of the amplifier of determining circuit 107. At time point t3, LAT is set to 'H' level, whereby the amplifier is activated and data is output to SAOUT.

At time point t4, WL, WLRef_L are set to non-selection level and LAT is set to 'L' level, whereby the amplifier is stopped.

In this manner, by causing PMOS transistors 103, 104 to operate not as precharge transistors but as mirror transistors in an LR verify operation, the timing of time point t3 can be set to similar timing as in a readout operation.

Figure 11:
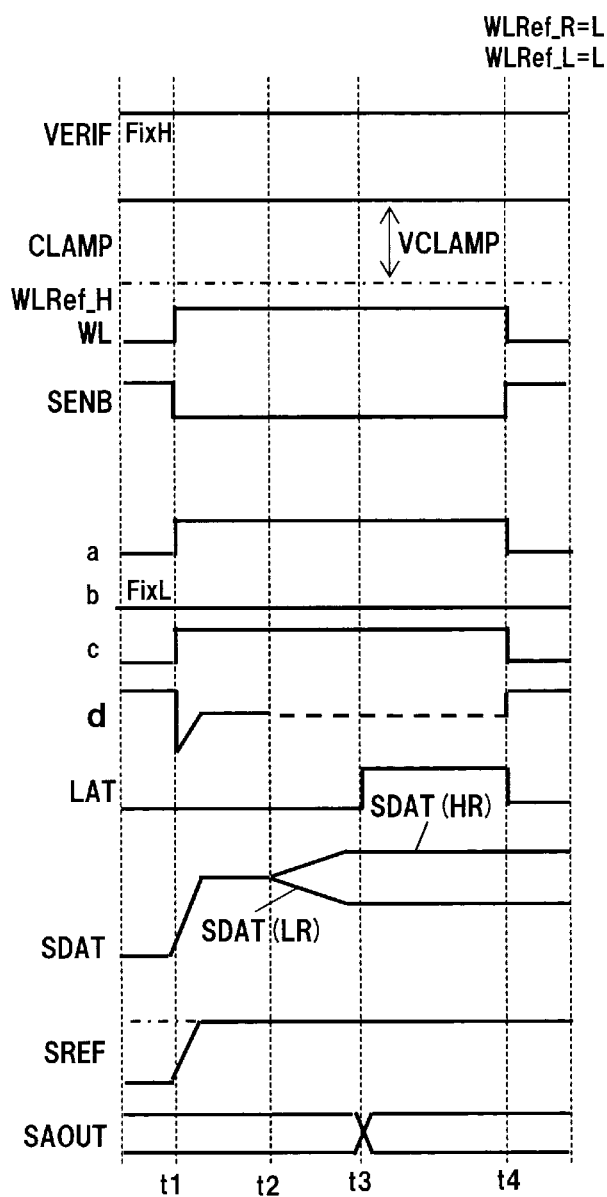
FIG. 11 is a chart showing HR verify operation waveforms using the nonvolatile semiconductor storage apparatus according to the first exemplary embodiment of the present disclosure.

Next, a description will be given of an increased resistance verifying operation (hereinafter referred to as an HR verify operation), which is a readout operation of verifying the high resistance state after a resistance increasing operation. FIG. 11 is a chart showing HR verify operation waveforms using the nonvolatile semiconductor storage apparatus according to the first exemplary embodiment of the present disclosure. VERIF is set to 'H' level, and WLRef_R, WLRef_L are set to non-selection level.

At time point t1, WLRef_H and WL are caused to transit to selection level and SENB is set to 'L' level, whereby control signals a, c transit to 'H' level and control signal d attains high impedance. By switch circuit 111, gate pg of PMOS transistors 103, 104 attains a voltage identical to SREF. This causes PMOS transistors 103, 104 to operate as mirror transistors, and charge SDAT, SREF, BL_DAT, BL_REF to a certain voltage in a period from time point t1 to time point t2. At this time, control signal b is fixed to 'L' level.

At time point t2, SDAT, SREF, BL_DAT, BL_REF are at a certain voltage level determined by the operating point.

In a period from time point t2 to time point t3, PMOS transistors 103, 104 operate as mirror transistors. Thus, since current passes through memory cell 101 and reference cell 102 by substantially the same amount, the voltage difference between SDAT and SREF results from the resistance difference between the memory cell and the reference cell.

When the memory cell is in the low resistance state (LR), SDAT voltage becomes lower than SREF voltage.

When the memory cell is in the high resistance state (HR), SDAT voltage becomes higher than SREF voltage.

Time point t3 is set to the timing at which the voltage difference between SDAT and SREF becomes greater than the amplification limit voltage of the amplifier of determining circuit 107. At time point t3, LAT is set to 'H' level, whereby the amplifier is activated and data is output to SAOUT.

At time point t4, WL, WLRef_H are set to non-selection level and LAT is set to 'L' level, whereby the amplifier is stopped.

As one mode of the nonvolatile semiconductor storage apparatus of the present disclosure, the control circuit may be structured as follows. The first transistor and the second transistor may be PMOS transistors. Further, in a first operation mode, the control circuit may set the first control terminal to energize the first and second transistors, set the second control terminal to disconnect the switch, and cause the first transistor and the second transistor to operate as precharge transistors that respectively apply a first voltage to the first terminal and the third terminal. Further, in a second operation mode, the control circuit may set the first control terminal to attain high impedance, set the second control terminal to short-circuit the switch, and cause the first transistor and the second transistor to operate as mirror transistors that respectively apply the first voltage to the first terminal and the third terminal. Further, one mode the nonvolatile semiconductor storage apparatus may include a memory cell, a reference cell, and a readout circuit that determines a data state based on a voltage difference resulting from a current difference between the memory cell and the reference cell to which voltage is applied. A first transistor may be connected to the memory cell. A second transistor may be connected to the reference cell. The first and second transistors may operate as precharge transistors in a first operation mode and operate as mirror transistors in a second operation mode. The first and second operation modes may be switched.

In this manner, by causing PMOS transistors 103, 104 to operate not as precharge transistors but as mirror transistors in an HR verify operation, the timing of time point t3 can be set to similar timing as in a readout operation.

In the present exemplary embodiment, while the description has been given of the case where the present disclosure is applied to both the LR verify operation and the HR verify operation, the present disclosure may be applied to just one of the LR verify operation and the HR verify operation. For example, the present disclosure is applied to just an LR verify operation where timing generation is difficult because of a short period between time point t2 and time point t3 if PMOS transistors 103, 104 operate as precharge transistors. On the other hand, in an HR verify operation, PMOS transistors 103, 104 operate as precharge transistors as in a readout operation. This realizes a further reduction in the steady-state memory cell current and reference current that are required in operation as precharge transistors than in the steady-state memory cell current and reference current that are required in operation as mirror transistors, and therefore current consumption can be reduced.

As one mode of the nonvolatile semiconductor storage apparatus of the present disclosure, the memory cell may be a variable resistance nonvolatile memory cell. In a normal readout operation and in a rewrite operation, a reduced resistance verifying operation and an increased resistance verifying operation may be performed, the reduced resistance verifying operation being a readout operation of verifying a resistance value after a resistance reducing operation, the increased resistance verifying operation being a readout operation of verifying a high resistance state after a resistance increasing operation. In the first operation mode, the normal readout operation may be performed. In the second operation mode, at least one of the increased resistance verifying operation and the reduced resistance verifying operation may be performed.

Further, although switch circuit 111 is provided between gate pg and SREF, switch circuit 111 may be provided between gate pg and SDAT.

Still further, PMOS transistors 103, 104 may be NMOS transistors. In this case, by changing control circuit 112, the effect similar to that described in the present exemplary embodiment can be exhibited.

Second Exemplary Embodiment

Figure 12:
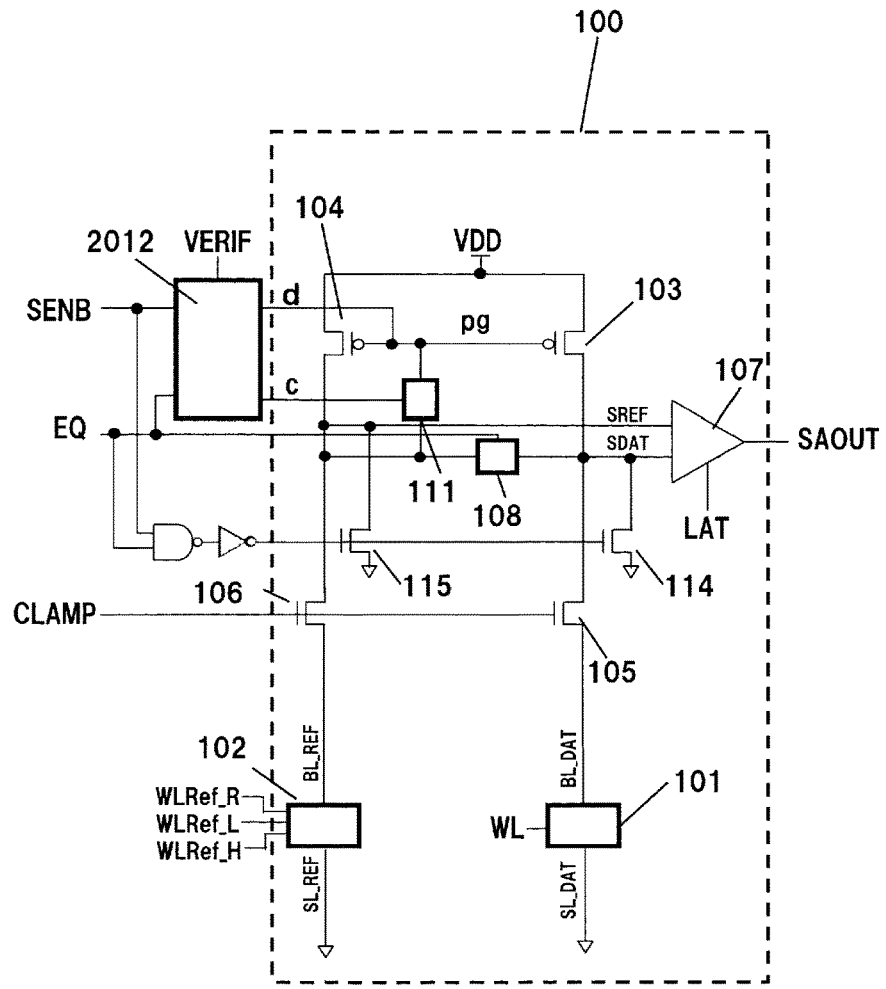
FIG. 12 is a circuit diagram of a nonvolatile semiconductor storage apparatus according to a second exemplary embodiment of the present disclosure.
Figure 13:
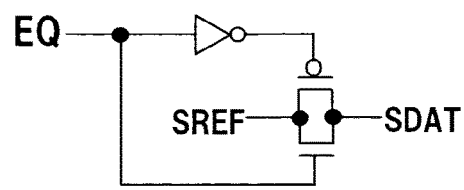
FIG. 13 is a circuit diagram of an equalizer circuit according to the second exemplary embodiment of the present disclosure.
Figure 14:
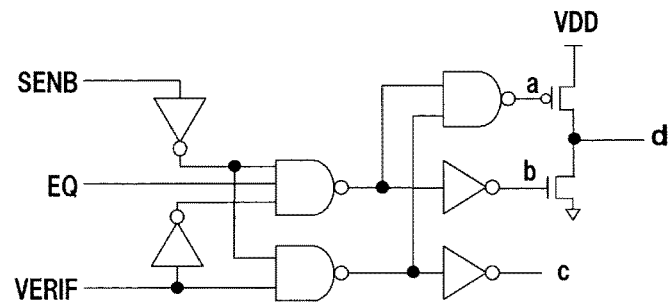
FIG. 14 is a circuit diagram of a control circuit according to the second exemplary embodiment of the present disclosure.

FIGS. 12 to 14 show the structure of a second exemplary embodiment of the present disclosure. FIG. 12 is a circuit diagram of a nonvolatile semiconductor storage apparatus according to the second exemplary embodiment of the present disclosure. Reference character 100 denotes a readout unit of 1-bit data of the nonvolatile semiconductor storage apparatus, which is arranged by 16 pieces for 16-bit data, with control signals and the like connected in common among the readout units. Reference character 101 denotes a memory cell (variable resistance nonvolatile memory cell). While FIG. 12 shows the case where single memory cell 101 is disposed for the sake of simplicity, the operation described below holds true for the case where a plurality of memory cells are disposed.

Reference character 102 denotes a reference cell. Reference characters 103 and 104 denote P-type metal-oxide-semiconductor (PMOS) transistors for applying voltage for data node SDAT being a determining node and reference node SREF. Reference character 111 denotes a switch circuit between pg and SREF. Reference characters 105 and 106 denote clamp transistors that control the voltage of bit line BL_DAT and reference bit line BL_REF to a certain voltage in operation. Reference character 107 denotes a determining circuit including an amplifier that amplifies the voltage difference between SDAT and SREF to a logic level and performs latching. Reference characters 114 and 115 denote discharge transistors of SDAT, SREF. Reference character 2012 denotes a control circuit that outputs control signals c, d for readout unit 100 in response to VERIF, SENB, EQ signals. Reference character 108 denotes an equalizer circuit.

The exemplary structure of memory cell 101, reference cell 102, switch circuit 111, and determining circuit 107 is similar to that described in the first exemplary embodiment.

FIG. 13 is a circuit diagram of the equalizer circuit according to the second exemplary embodiment of the present disclosure. FIG. 13 shows the structure of equalizer circuit 108. Equalizer circuit 108 performs an operation of equalizing the voltage of SDAT and SREF or an operation of disconnecting SDAT and SREF in response to equalize signal EQ.

FIG. 14 is a circuit diagram of the control circuit according to the second exemplary embodiment of the present disclosure. FIG. 14 shows the structure of control circuit 2012. Control circuit 2012 outputs control signals c, d in response to SENB, EQ, VERIF signals.

Figure 15:
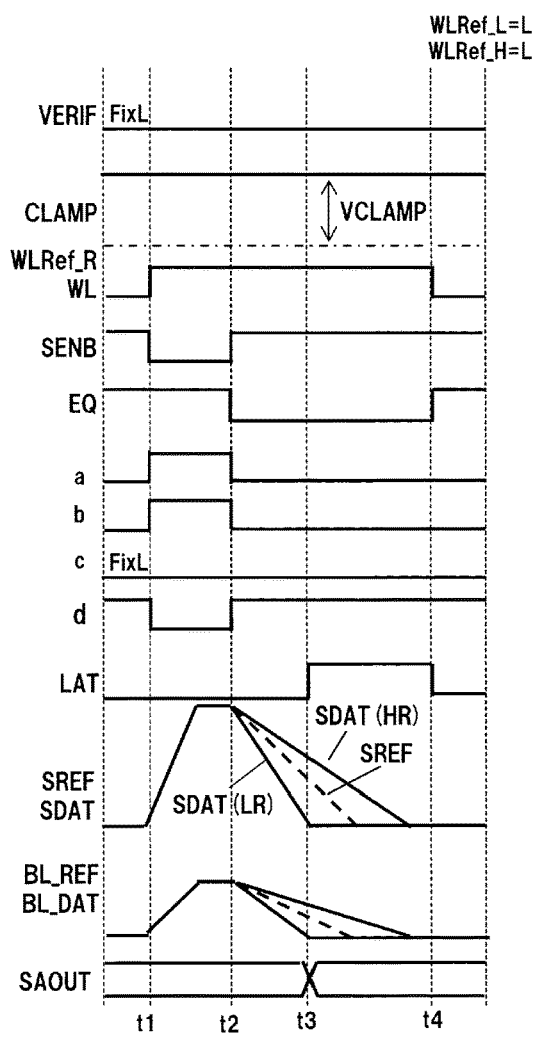
FIG. 15 is a chart showing readout operation waveforms using the nonvolatile semiconductor storage apparatus according to the second exemplary embodiment of the present disclosure.

Next, a description will be given of a readout operation. FIG. 15 is a chart showing readout operation waveforms using the nonvolatile semiconductor storage apparatus according to the second exemplary embodiment of the present disclosure. VERIF is set to 'L' level, and CLAMP voltage is set to a certain voltage (VCLAMP). Further, WLRef_L, WLRef_H are set to non-selection level. EQ is set to 'H' level.

At time point t1, WLRef_R and WL are caused to transit to selection level and SENB is set to 'L' level, whereby control signals a, b transit to 'H' level. This causes PMOS transistors 103, 104 to operate as precharge transistors and start precharging SDAT, SREF. As this time, control signal c is fixed to 'L' level.

At time point t2, SENB is set to 'H' level and EQ is set to 'L' level, whereby control signals a, b transit to 'L' level, stopping the precharging and the equalizing. At this time, SDAT, SREF are substantially at VDD level, and BL_DAT, BL_REF are at VCLAMP−Vtn level where Vtn is the threshold voltage of clamp transistors 105, 106.

In a period from time point t2 to time point t3, SDAT, SREF, and BL_DAT, BL_REF are discharged through memory cell 101 and reference cell 102.

When the memory cell is in the low resistance state (LR), SDAT voltage reduces faster than SREF voltage.

When the memory cell is in the high resistance state (HR), SDAT voltage reduces slower than SREF voltage.

Time point t3 is set to the timing at which the voltage difference between SDAT and SREF becomes greater than the amplification limit voltage of the amplifier of determining circuit 107. At time point t3, LAT is set to 'H' level, whereby the amplifier is activated and data is output to SAOUT.

At time point t4, WL, WLRef_R are set to non-selection level, and EQ is set to 'H' level thereby equalizing SREF, SDAT. LAT is set to 'L' level, whereby the amplifier is stopped.

Figure 16:
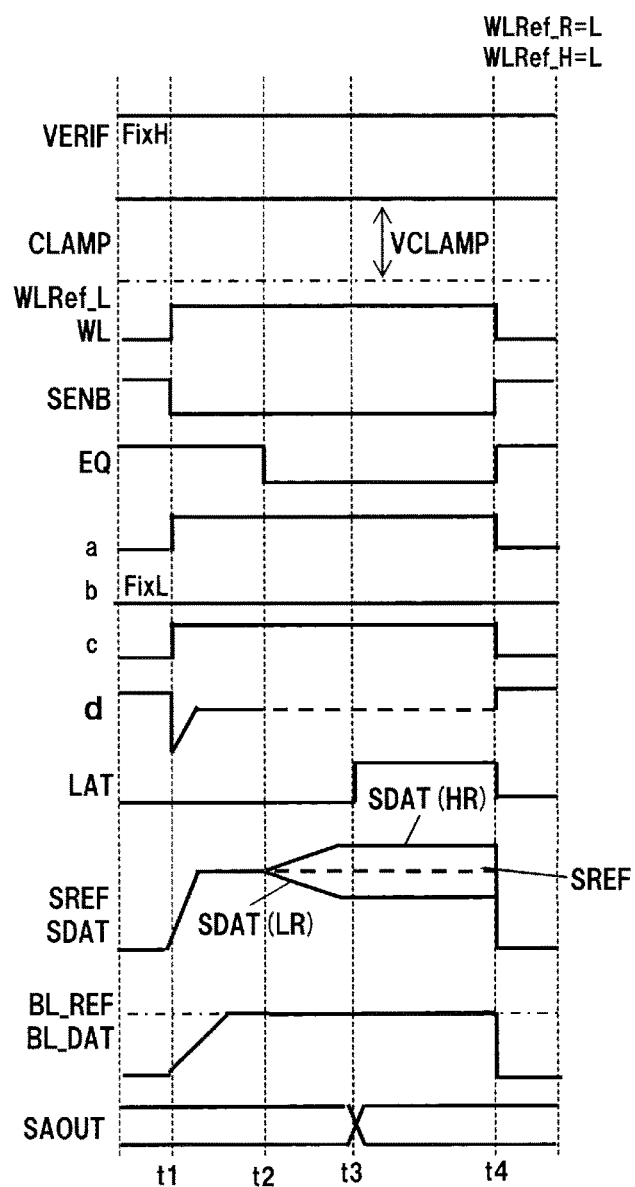
FIG. 16 is a chart showing LR verify operation waveforms using the nonvolatile semiconductor storage apparatus according to the second exemplary embodiment of the present disclosure.

Next, a description will be given of an LR verify operation. FIG. 16 is a chart showing LR verify operation waveforms using the nonvolatile semiconductor storage apparatus according to the second exemplary embodiment of the present disclosure. VERIF is set to 'H' level, and CLAMP voltage is set to a certain voltage (VCLAMP). Further, WLRef_R, WLRef_H are set to non-selection level.

At time point t1, WLRef_L and WL are caused to transit to selection level. Thus, by setting SENB to 'L' level, control signals a, c transit to 'H' level, and control signal d attains high impedance. By switch circuit 111, in a period from time point t1 to time point t2, gate pg of PMOS transistors 103, 104 attains a voltage identical to SREF. This causes PMOS transistors 103, 104 to operate as mirror transistors, and charge SDAT, SREF, BL_DAT, BL_REF to a certain voltage. At this time, control signal b is fixed to 'L' level.

At time point t2, EQ is set to 'L' level, whereby the equalizing is stopped. At this time, SDAT, SREF are at a certain voltage level determined by the operating point. BL_DAT, BL_REF are at VCLAMP−Vtn level where Vtn is the threshold voltage of clamp transistors 105, 106.

In a period from time point t2 to time point t3, PMOS transistors 103, 104 operate as mirror transistors. Thus, since current passes through memory cell 101 and reference cell 102 by substantially the same amount, the voltage difference between SDAT and SREF results from the resistance difference between the memory cell and the reference cell.

When the memory cell is in the low resistance state (LR), SDAT voltage becomes lower than SREF voltage.

When the memory cell is in the high resistance state (HR), SDAT voltage becomes higher than SREF voltage.

Time point t3 is set to the timing at which the voltage difference between SDAT and SREF becomes greater than the amplification limit voltage of the amplifier of determining circuit 107. At time point t3, LAT is set to 'H' level, whereby the amplifier is activated and data is output to SAOUT.

At time point t4, WL, WLRef_L are set to non-selection level and SENB, EQ are set to 'H' level, whereby SREF, SDAT are discharged and equalized. Further, LAT is set to 'L' level, whereby the amplifier is stopped.

In this manner, by causing PMOS transistors 103, 104 to operate not as precharge transistors but as mirror transistors in an LR verify operation, the timing of time point t3 can be set to similar timing as in a readout operation.

Figure 17:
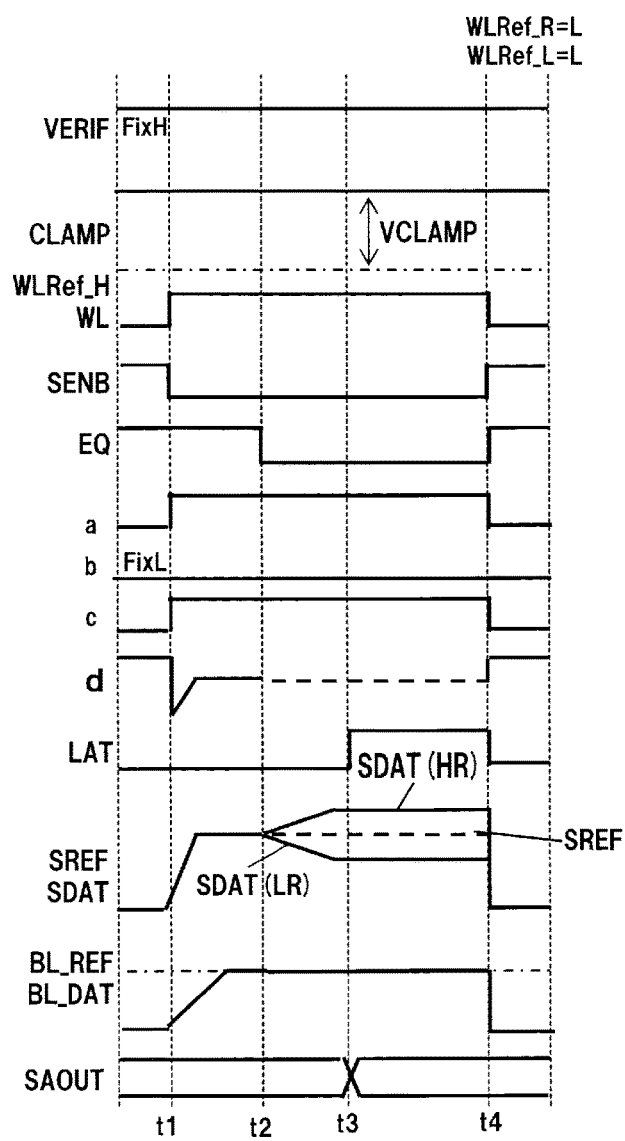
FIG. 17 is a chart showing HR verify operation waveforms using the nonvolatile semiconductor storage apparatus according to the second exemplary embodiment of the present disclosure.

Next, a description will be given of an HR verify operation. FIG. 17 is a chart showing HR verify operation waveforms using the nonvolatile semiconductor storage apparatus according to the second exemplary embodiment of the present disclosure. VERIF is set to 'H' level, and CLAMP voltage is set to a certain voltage (VCLAMP). Further, WLRef_R, WLRef_L are set to non-selection level.

At time point t1, WLRef_H and WL are caused to transit to selection level and SENB is set to 'L' level, whereby control signals a, c transit to 'H' level and control signal d attains high impedance. By switch circuit 111, gate pg of PMOS transistors 103, 104 attains a voltage identical to SREF, and PMOS transistors 103, 104 operate as mirror transistors. PMOS transistors 103, 104 charge SDAT, SREF, BL_DAT, BL_REF to a certain voltage in a period from time point t1 to time point t2. At this time, control signal b is fixed to 'L' level.

At time point t2, EQ is set to 'L' level, whereby the equalizing is stopped. At this time, SDAT, SREF are at a certain voltage level determined by the operating point, and BL_DAT, BL_REF are at VCLAMP−Vtn level where Vtn is the threshold voltage of clamp transistors 105, 106.

In a period from time point t2 to time point t3, PMOS transistors 103, 104 operate as mirror transistors, and current passes through memory cell 101 and reference cell 102 by substantially the same amount. Thus, the voltage difference between SDAT and SREF results from the resistance difference between the memory cell and the reference cell.

When the memory cell is in the low resistance state (LR), SDAT voltage becomes lower than SREF voltage.

When the memory cell is in the high resistance state (HR), SDAT voltage becomes higher than SREF voltage.

Time point t3 is set to the timing at which the voltage difference between SDAT and SREF becomes greater than the amplification limit voltage of the amplifier of determining circuit 107. At time point t3, LAT is set to 'H' level, whereby the amplifier is activated and data is output to SAOUT.

At time point t4, WL, WLRef_H are set to non-selection level and SENB, EQ are set to 'H' level, whereby SREF, SDAT are discharged and equalized. LAT is set to 'L' level, whereby the amplifier is stopped.

In this manner, by causing PMOS transistors 103, 104 to operate not as precharge transistors but as mirror transistors in an HR verify operation, the timing of time point t3 can be set to similar timing as in a readout operation.

In the present exemplary embodiment, the discharge transistors and the equalizer circuit realize a faster operation in the period from time point t1 to time point t2 than with the nonvolatile semiconductor storage apparatus according to the first exemplary embodiment.

In the present exemplary embodiment, while the description has been given of the case where the present disclosure is applied to both the LR verify operation and the HR verify operation, the present disclosure may be applied to just one of the LR verify operation and the HR verify operation. For example, the present disclosure is applied to just an LR verify operation where timing generation is difficult because of a short period between time point t2 and time point t3 if PMOS transistors 103, 104 operate as precharge transistors. On the other hand, in an HR verify operation, PMOS transistors 103, 104 operate as precharge transistors as in a readout operation. This realizes a further reduction in the steady-state memory cell current and reference current that are required in operation as precharge transistors than in the steady-state memory cell current and reference current that are required in operation as mirror transistors, and therefore current consumption can be reduced.

Further, although switch circuit 111 is provided between gate pg and SREF, switch circuit 111 may be provided between gate pg and SDAT.

Still further, PMOS transistors 103, 104 may be N-type metal-oxide-semiconductor (NMOS) transistors. In this case, by changing control circuit 2012 shown in FIG. 14, the effect similar to that described in the present exemplary embodiment can be exhibited.

Third Exemplary Embodiment

Figure 18:
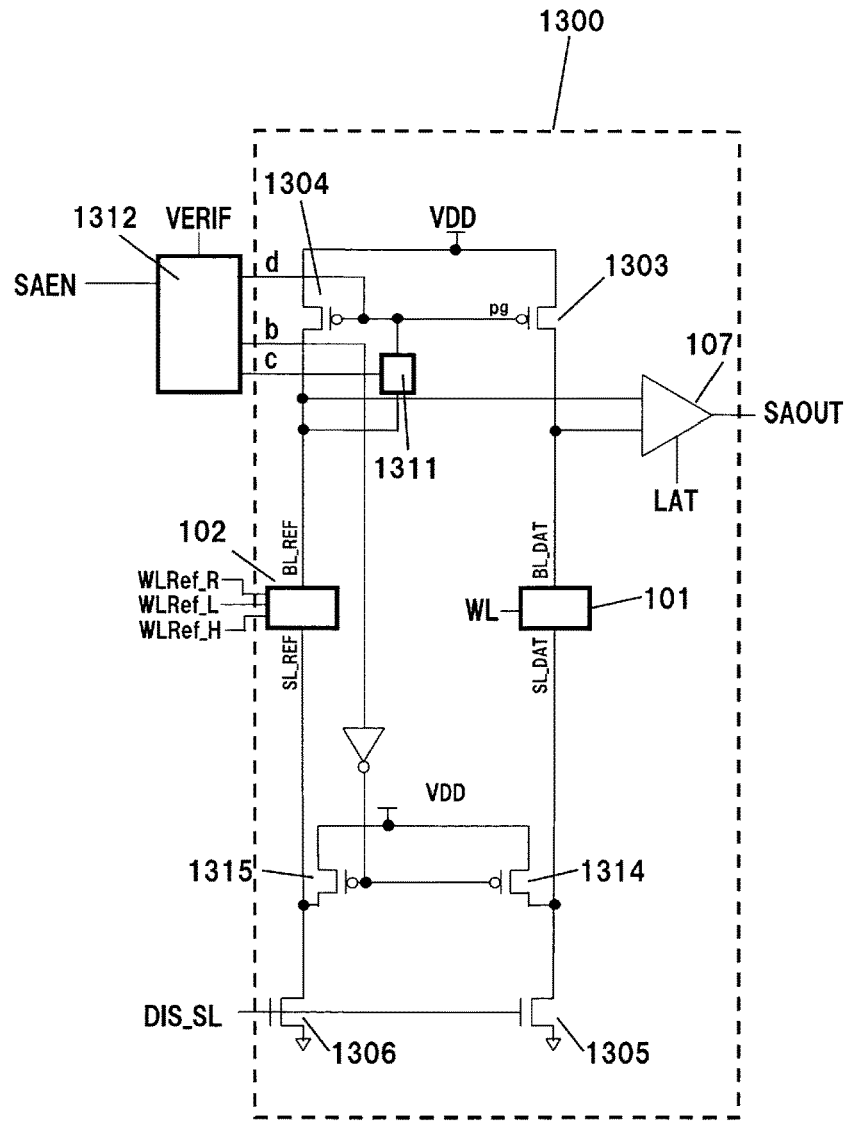
FIG. 18 is a circuit diagram of a nonvolatile semiconductor storage apparatus according to a third exemplary embodiment of the present disclosure.
Figure 19:
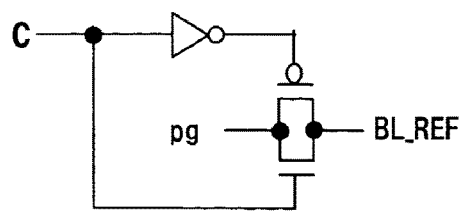
FIG. 19 is a circuit diagram of a switch circuit according to the third exemplary embodiment of the present disclosure.
Figure 20:
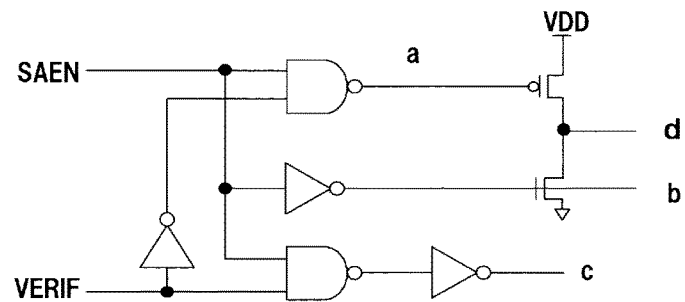
FIG. 20 is a circuit diagram of a control circuit according to the third exemplary embodiment of the present disclosure.

FIGS. 18 to 20 show the structure of a third exemplary embodiment of the present disclosure.

FIG. 18 is a circuit diagram of a nonvolatile semiconductor storage apparatus according to the third exemplary embodiment of the present disclosure. Reference character 1300 denotes a readout unit of 1-bit data of the nonvolatile semiconductor storage apparatus, which is arranged by 16 pieces for 16-bit data, with control signals and the like connected in common among the readout units. Reference character 101 denotes a memory cell (variable resistance nonvolatile memory cell). While FIG. 18 shows the case where single memory cell 101 is disposed for the sake of simplicity, the operation described below holds true for the case where a plurality of memory cells are disposed.

Reference character 102 denotes a reference cell. Reference characters 1303 and 1304 denote P-type metal-oxide-semiconductor (PMOS) transistors for applying voltage to bit line BL_DAT being a determining node and reference bit line BL_REF. Reference character 1311 denotes a switch circuit between pg and BL_REF. Reference character 107 denotes a determining circuit including an amplifier that amplifies the voltage difference between SDAT and SREF to a logic level and performs latching. Reference characters 1314 and 1315 denote precharge transistors of SL_DAT, SL_REF. Reference characters 1305, 1306 denote discharge transistors of SL_DAT, SL_REF. Reference character 1312 denotes a control circuit that outputs control signals b, c, d for readout unit 1300 in response to VERIF, SAEN signals.

The exemplary structure of memory cell 101, reference cell 102, and determining circuit 107 is similar to that described in the first exemplary embodiment.

FIG. 19 is a circuit diagram of the switch circuit according to the third exemplary embodiment of the present disclosure. FIG. 19 shows the structure of switch circuit 1311. Switch circuit 1311 performs an operation of short-circuiting or disconnecting between pg and BL_REF in response to control signal c.

FIG. 20 is a circuit diagram of the control circuit according to the third exemplary embodiment of the present disclosure. FIG. 20 shows the structure of control circuit 1312. Control circuit 1312 controls control signals b, c, d in response to SAEN, VERIF signals.

Figure 21:
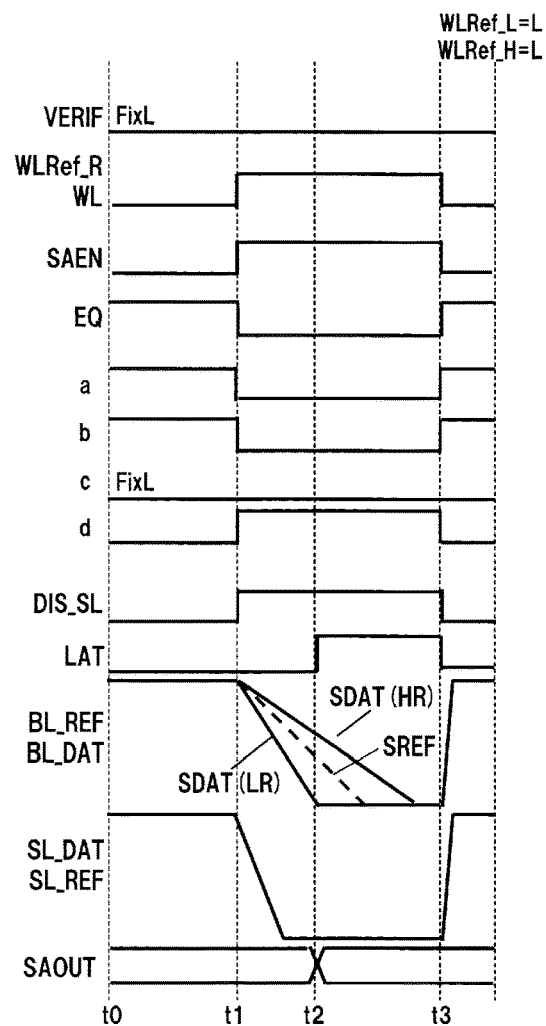
FIG. 21 is a chart showing readout operation waveforms of the nonvolatile semiconductor storage apparatus according to the third and fourth exemplary embodiments of the present disclosure.

Next, a description will be given of a readout operation. FIG. 21 is a chart showing readout operation waveforms using the nonvolatile semiconductor storage apparatus according to the third and fourth exemplary embodiments of the present disclosure. VERIF is set to 'L' level, and WLRef_L, WLRef_H are set to non-selection level.

At time point t0, since SAEN is set to 'L' level and control signals a, b are set to 'H' level, BL_DAT, BL_REF, SL_DAT, SL_REF are precharged to VDD.

At time point t1, WL_Ref_R and WL are caused to transit to selection level and SAEN is set to 'H' level, whereby control signals a, b transit to 'L' level, and control signal d transits to 'H' level. The precharging is stopped, and DIS_SL is set to 'H' level.

In a period from time point t1 to time point t2, SL_REF, SL_DAT are discharged by discharge transistors 1305, 1306. Simultaneously, BL_DAT, BL_REF are discharged through memory cell 101 and reference cell 102.

When the memory cell is in the low resistance state (LR), BL_DAT voltage reduces faster than BL_REF voltage.

When the memory cell is in the high resistance state (HR), BL_DAT voltage reduces slower than BL_REF voltage.

Time point t2 is set to the timing at which the voltage difference between BL_DAT and BL_REF becomes greater than the amplification limit voltage of the amplifier of determining circuit 107. At time point t2, LAT is set to 'H' level, whereby the amplifier is activated and data is output to SAOUT.

At time point t3, WL, WLRef_R are set to non-selection level and SAEN is set to 'L' level, whereby BL_DAT, BL_REF, SL_DAT, SL_REF are precharged. Further, LAT is set to 'L' level, whereby the amplifier is stopped.

Figure 22:
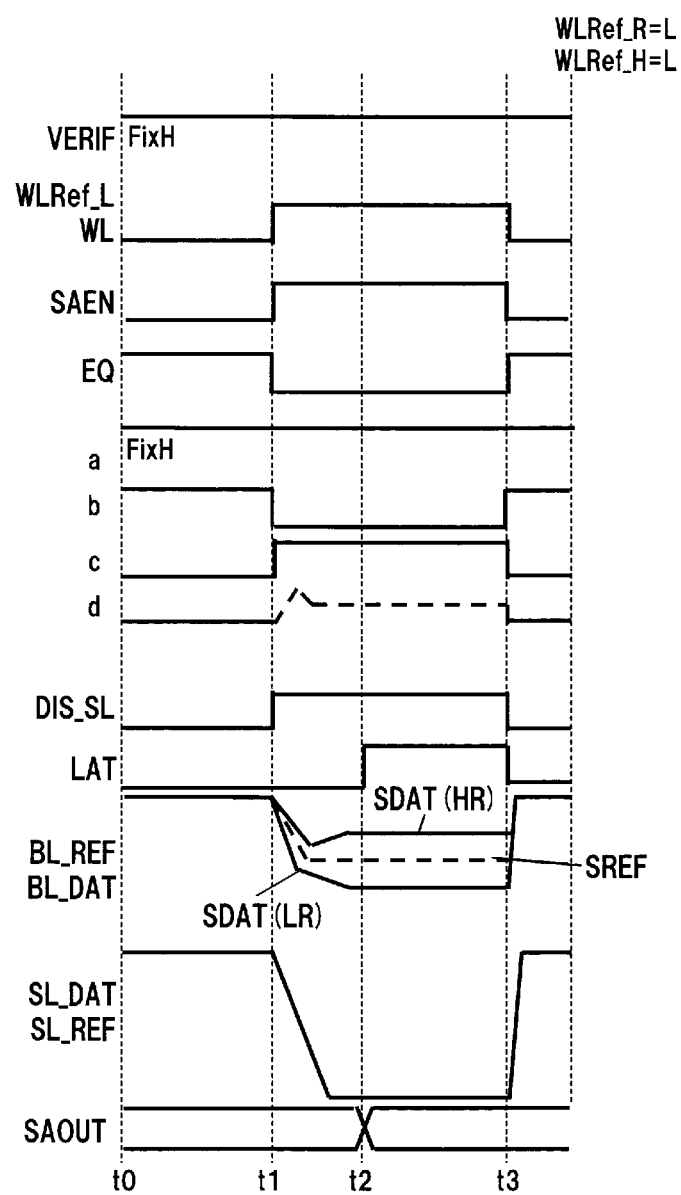
FIG. 22 is a chart showing LR verify operation waveforms using the nonvolatile semiconductor storage apparatus according to the third and fourth exemplary embodiments of the present disclosure.

Next, a description will be given of an LR verify operation. FIG. 22 is a chart showing LR verify operation waveforms using the nonvolatile semiconductor storage apparatus according to the third and fourth exemplary embodiments of the present disclosure. VERIF is set to 'H' level, and WLRef_R, WLRef_H are set to non-selection level.

At time point t0, since SAEN is set to 'L' level and control signals a, b are set to 'H' level, BL_DAT, BL_REF, SL_DAT, SL_REF are precharged to VDD.

At time point t1, WLRef_L and WL are caused to transit to selection level, and SAEN is set to 'H' level. Thus, control signal b transits to 'L' level, control signal c transits to 'H' level, and control signal d attains high impedance. This causes gate pg of PMOS transistors 1303, 1304 to attain a voltage identical to SREF. The precharging is stopped, and DIS_SL is set to 'H' level. At this time, control signal b transits to 'L' level.

In a period from time point t1 to time point t2, SL_REF, SL_DAT are discharged by discharge transistors 1305, 1306. Simultaneously, BL_DAT, BL_REF are discharged through memory cell 101 and reference cell 102.

Here, gate pg of PMOS transistors 1303, 1304 and BL_REF are at the identical voltage, and PMOS transistors 1303, 1304 operate as mirror transistors. Accordingly, current passes through memory cell 101 and reference cell 102 by substantially the same amount. Thus, the voltage difference between BL_DAT and BL_REF results from the resistance difference between the memory cell and the reference cell.

When the memory cell is in the low resistance state (LR), SDAT voltage becomes lower than SREF voltage.

When the memory cell is in the high resistance state (HR), SDAT voltage becomes higher than SREF voltage.

Time point t2 is set to the timing at which the voltage difference between SDAT and SREF becomes greater than the amplification limit voltage of the amplifier of determining circuit 107. At time point t2, LAT is set to 'H' level, whereby the amplifier is activated and data is output to SAOUT.

At time point t3, WL, WLRef_L are set to non-selection level and SAEN is set to 'L' level. Thus, BL_DAT, BL_REF, SL_DAT, SL_REF are precharged. LAT is set to 'L' level, whereby the amplifier is stopped.

In this manner, by causing PMOS transistors 1303, 1304 to operate not as precharge transistors but as mirror transistors in an LR verify operation, time point t2 can be set to similar timing as in a readout operation.

Figure 23:
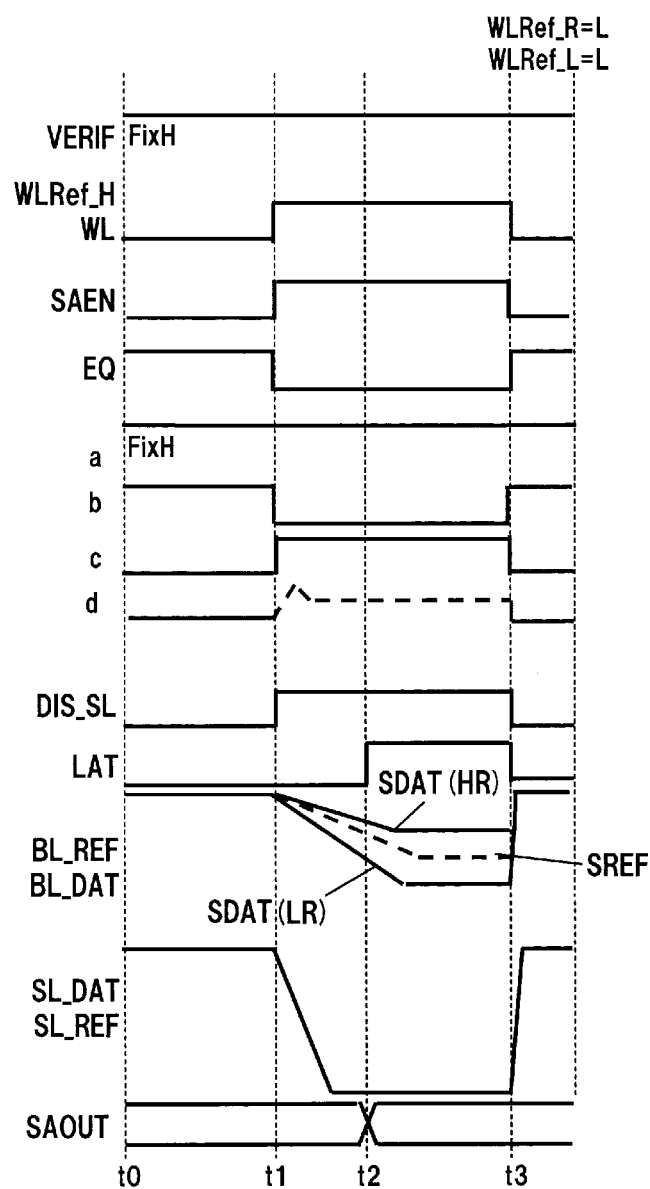
FIG. 23 is a chart showing HR verify operation waveforms using the nonvolatile semiconductor storage apparatus according to the third and fourth exemplary embodiments of the present disclosure.

Next, a description will be given of an HR verify operation. FIG. 23 is a chart showing HR verify operation waveforms using the nonvolatile semiconductor storage apparatus according to the third and fourth exemplary embodiments of the present disclosure. VERIF is set to 'H' level, and WLRef_R, WLRef_L are set to non-selection level.

At time point t0, since SAEN is set to 'L' level, and control signals a, b are set to 'H' level, BL_DAT, BL_REF, SL_DAT, SL_REF are precharged to VDD.

At time point t1, WLRef_H and WL are caused to transit to selection level and SAEN is set to 'H' level, whereby control signal b transits to 'L' level and control signal c transits to 'H' level, and control signal d attains high impedance. This causes gate pg of PMOS transistors 1303, 1304 to attain a voltage identical to SREF. Simultaneously, DIS_SL is set to 'H' level. At this time, control signal b transits to 'L' level.

In a period from time point t1 to time point t2, SL_REF, SL_DAT are discharged by discharge transistors 1305, 1306. Simultaneously, BL_DAT, BL_REF are discharged through memory cell 101 and reference cell 102.

Here, gate pg of PMOS transistors 1303, 1304 and BL_REF are at the identical voltage, and PMOS transistors 1303, 1304 operate as mirror transistors. Accordingly, current passes through memory cell 101 and reference cell 102 by substantially the same amount. Thus, the voltage difference between BL_DAT and BL_REF results from the resistance difference between the memory cell and the reference cell.

When the memory cell is in the low resistance state (LR), SDAT voltage becomes lower than SREF voltage.

When the memory cell is in the high resistance state (HR), SDAT voltage becomes higher than SREF voltage.

Time point t2 is set to the timing at which the voltage difference between SDAT and SREF becomes greater than the amplification limit voltage of the amplifier of determining circuit 107. At time point t2, LAT is set to 'H' level, whereby the amplifier is activated and data is output to SAOUT.

At time point t3, WL, WLRef_H are set to non-selection level and SAEN is set to 'L' level. Thus, BL_DAT, BL_REF, SL_DAT, SL_REF are precharged and equalized. LAT is set to 'L' level, whereby the amplifier is stopped.

In this manner, by causing PMOS transistors 1303, 1304 to operate not as precharge transistors but as mirror transistors in an HR verify operation, time point t2 can be set to similar timing as in a readout operation.

In the present exemplary embodiment, while the description has been given of the case where the present disclosure is applied to both the LR verify operation and the HR verify operation, the present disclosure may be applied to just one of the LR verify operation and the HR verify operation. For example, the present disclosure is applied to just an LR verify operation where timing generation is difficult because of a short period between time point t1 and time point t2 if PMOS transistors 1303, 1304 operate as precharge transistors. On the other hand, in an HR verify operation, PMOS transistors 1303, 1304 operate as precharge transistors as in a readout operation. This realizes a further reduction in the steady-state memory cell current and reference current that are required in operation as precharge transistors than in the steady-state memory cell current and reference current that are required in operation as mirror transistors, and therefore current consumption can be reduced.

Further, although switch circuit 1311 is provided between gate pg and BL_REF, switch circuit 1311 may be provided between gate pg and BL_DAT.

Still further, PMOS transistors 1303, 1304 may be N-type metal-oxide-semiconductor (NMOS) transistors. In this case, by changing control circuit 1312, the effect similar to that described in the present exemplary embodiment can be exhibited.

Fourth Exemplary Embodiment

Figure 24:
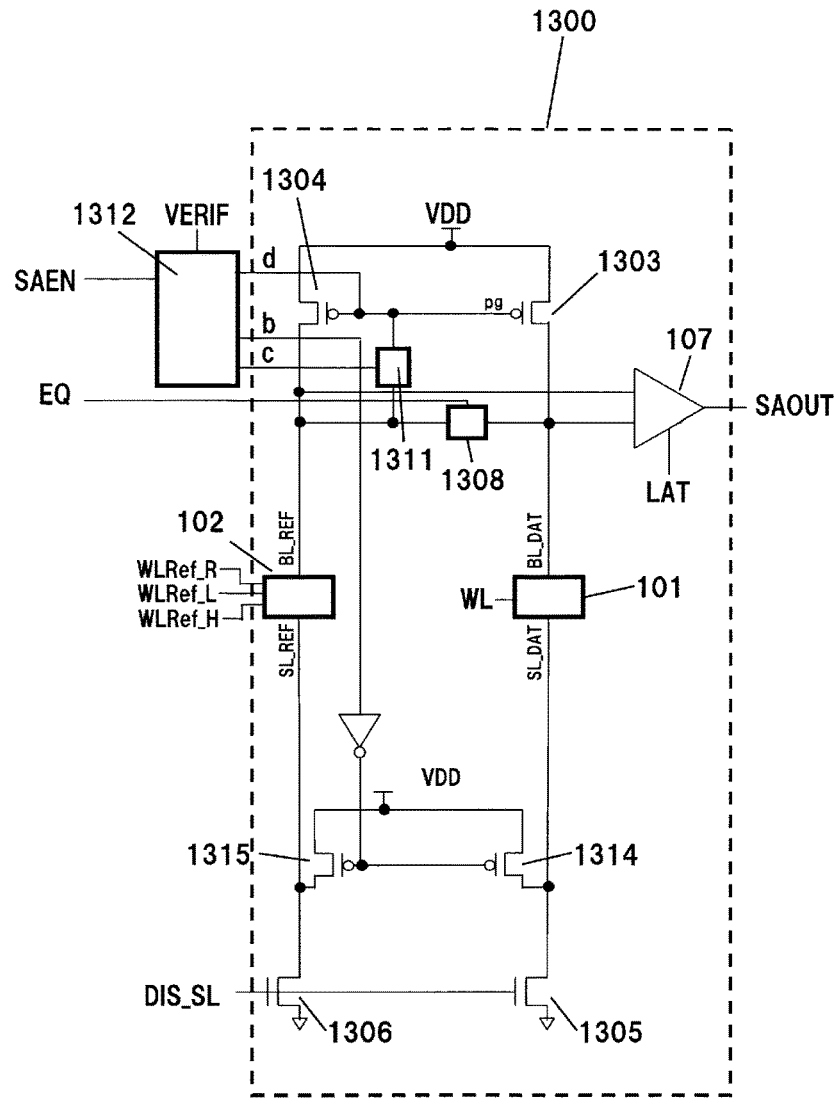
FIG. 24 is a circuit diagram of the nonvolatile semiconductor storage apparatus according to the fourth exemplary embodiment of the present disclosure.
Figure 25:
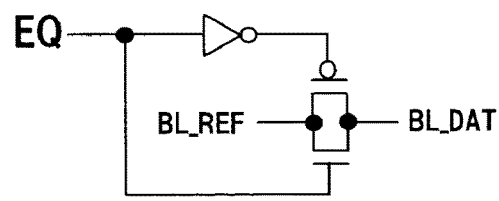
FIG. 25 is a circuit diagram of an equalizer circuit according to the fourth exemplary embodiment of the present disclosure.

FIGS. 24 to 25 show the structure of a fourth exemplary embodiment of the present disclosure. FIG. 24 is a circuit diagram of a nonvolatile semiconductor storage apparatus according to the fourth exemplary embodiment of the present disclosure. Reference character 1300 denotes a readout unit of 1-bit data of the nonvolatile semiconductor storage apparatus, which is arranged by 16 pieces for 16-bit data, with control signals and the like connected in common among the readout units. Reference character 101 denotes a memory cell (variable resistance nonvolatile memory cell). While FIG. 24 shows the case where single memory cell 101 is disposed for the sake of simplicity, the operation described below holds true for the case where a plurality of memory cells are disposed.

Reference character 102 denotes a reference cell. Reference characters 1303 and 1304 denote P-type metal-oxide-semiconductor (PMOS) transistors for applying voltage to bit line BL_DAT being a determining node and reference bit line BL_REF. Reference character 1311 denotes a switch circuit between pg and BL_REF. Reference characters 1305, 1306 denote N-type metal-oxide-semiconductor (NMOS) transistors that discharge source line SL_DAT and reference source line SL_REF. Reference character 107 denotes a determining circuit including an amplifier that amplifies the voltage difference between SDAT and SREF to a logic level and performs latching. Reference characters 1314 and 1315 denote precharge transistors of SL_DAT, SL_REF. Reference character 1312 denotes a control circuit that outputs control signals b, c, d for readout unit 1300 in response to VERIF, SAEN signals.

The exemplary structure of memory cell 101, reference cell 102 and determining circuit 107 is similar to that described in first exemplary embodiment.

FIG. 25 is a circuit diagram of the equalizer circuit according to the fourth exemplary embodiment of the present disclosure. FIG. 25 shows the structure of equalizer circuit 1308. Equalizer circuit 1308 performs an operation of equalizing BL_DAT and BL_REF to an identical voltage or an operation of disconnecting BL_DAT and BL_REF in response to equalize signal EQ.

Next, a description will be given of a readout operation. FIG. 21 is a chart showing readout operation waveforms using the nonvolatile semiconductor storage apparatus according to the third and fourth exemplary embodiments of the present disclosure. VERIF is set to 'L' level, and WLRef_L, WLRef_H are set to non-selection level.

At time point to, since SAEN is set to 'L' level and control signals a, b are set to 'H' level, BL_DAT, BL_REF, SL_DAT, SL_REF are precharged to VDD.

At time point t1, WL_Ref_R and WL are caused to transit to selection level and SAEN is set to 'H' level, whereby control signals a, b transit to 'L' level. Simultaneously, EQ is set to 'L' level, whereby the precharging and the equalizing are stopped. DIS_SL is set to 'H' level.

In a period from time point t1 to time point t2, SL_REF, SL_DAT are discharged by discharge transistors 1305, 1306. Simultaneously, BL_DAT, BL_REF are discharged through memory cell 101 and reference cell 102.

When the memory cell is in the low resistance state (LR), BL_DAT voltage reduces faster than BL_REF voltage.

When the memory cell is in the high resistance state (HR), BL_DAT voltage reduces slower than BL_REF voltage.

Time point t2 is set to the timing at which the voltage difference between BL_DAT and BL_REF becomes greater than the amplification limit voltage of the amplifier of determining circuit 107. At time point t2, LAT is set to 'H' level, whereby the amplifier is activated and data is output to SAOUT.

At time point t3, WL, WLRef_R are set to non-selection level, and SAEN is set to 'L' level and EQ is set to 'H' level. Thus, BL_DAT, BL_REF, SL_DAT, SL_REF are precharged and equalized. LAT is set to 'L' level, whereby the amplifier is stopped.

Next, a description will be given of an LR verify operation. FIG. 22 is a chart showing LR verify operation waveforms using the nonvolatile semiconductor storage apparatus according to the third and fourth exemplary embodiments of the present disclosure. VERIF is set to 'H' level, and WLRef_R, WLRef_H are set to non-selection level.

At time point to, since SAEN is set to 'L' level and control signals a, b are set to 'H' level, BL_DAT, BL_REF, SL_DAT, SL_REF are precharged to VDD.

At time point t1, WLRef_L and WL are caused to transit to selection level and SAEN is set to 'H' level, whereby control signal b transits to 'L' level and control signal c transits to 'H' level. This causes gate pg of PMOS transistors 1303, 1304 to attain a voltage identical to SREF. Simultaneously, EQ is set to 'L' level, whereby the precharging and the equalizing are stopped. DIS_SL is set to 'H' level. At this time, control signal b transits to 'L' level.

In a period from time point t1 to time point t2, SL_REF, SL_DAT are discharged by discharge transistors 1305, 1306. Simultaneously, BL_DAT, BL_REF are discharged through memory cell 101 and reference cell 102.

Here, gate pg of PMOS transistors 1303, 1304 and BL_REF are at the identical voltage, and PMOS transistors 1303, 1304 operate as mirror transistors. Accordingly, current passes through memory cell 101 and reference cell 102 by substantially the same amount. Thus, the voltage difference between BL_DAT and BL_REF results from the resistance difference between the memory cell and the reference cell.

When the memory cell is in the low resistance state (LR), SDAT voltage becomes lower than SREF voltage.

When the memory cell is in the high resistance state (HR), SDAT voltage becomes higher than SREF voltage.

Time point t2 is set to the timing at which the voltage difference between SDAT and SREF becomes greater than the amplification limit voltage of the amplifier of determining circuit 107. At time point t2, LAT is set to 'H' level, whereby the amplifier is activated and data is output to SAOUT.

At time point t3, WL, WLRef_L are set to non-selection level, and SAEN is set to 'L' level and EQ is set to 'H' level. Thus, BL_DAT, BL_REF, SL_DAT, SL_REF are precharged and equalized. LAT is set to 'L' level, whereby the amplifier is stopped.

In this manner, by causing PMOS transistors 1303, 1304 to operate not as precharge transistors but as mirror transistors in an LR verify operation, time point t2 can be set to similar timing as in a readout operation.

Next, a description will be given of an HR verify operation. FIG. 23 is a chart showing HR verify operation waveforms using the nonvolatile semiconductor storage apparatus according to the third and fourth exemplary embodiments of the present disclosure. VERIF is set to 'H' level, and WLRef_R, WLRef_L are set to non-selection level.

At time point t0, since SAEN is set to 'L' level and control signals a, b are set to 'H' level, BL_DAT, BL_REF, SL_DAT, SL_REF are precharged to VDD.

At time point t1, WLRef_H and WL are caused to transit to selection level and SAEN is set to 'H' level. Thus, control signal b transits to 'L' level and control signal c transits to 'H' level, and gate pg of PMOS transistors 1303, 1304 attains a voltage identical to SREF. Simultaneously, EQ is set to 'L' level whereby the precharging and the equalizing are stopped. DIS_SL is set to 'H' level. At this time, control signal b transits to 'L' level.

In a period from time point t1 to time point t2, SL_REF, SL_DAT are discharged by discharge transistors 1305, 1306. Simultaneously, BL_DAT, BL_REF are discharged through memory cell 101 and reference cell 102.

Here, gate pg of PMOS transistors 1303, 1304 and BL_REF are at the identical voltage, and PMOS transistors 1303, 1304 operate as mirror transistors. Accordingly, current passes through memory cell 101 and reference cell 102 by substantially the same amount. Thus, the voltage difference between BL_DAT and BL_REF results from the resistance difference between the memory cell and the reference cell.

When the memory cell is in the low resistance state (LR), SDAT voltage becomes lower than SREF voltage.

When the memory cell is in the high resistance state (HR), SDAT voltage becomes higher than SREF voltage.

Time point t2 is set to the timing at which the voltage difference between SDAT and SREF becomes greater than the amplification limit voltage of the amplifier of determining circuit 107. At time point t2, LAT is set to 'H' level, whereby the amplifier is activated and data is output to SAOUT.

At time point t3, WL, WLRef_H are set to non-selection level. SAEN is set to 'L' level and EQ is set to 'H' level. Thus, BL_DAT, BL_REF, SL_DAT, SL_REF are precharged and equalized. LAT is set to 'L' level, whereby the amplifier is stopped.

In this manner, by causing PMOS transistors 1303, 1304 to operate not as precharge transistors but as mirror transistors in an HR verify operation, time point t2 can be set to similar timing as in a readout operation.

In the present exemplary embodiment, the discharge transistors and the equalizer circuit realize a faster operation than with the nonvolatile semiconductor storage apparatus according to the third exemplary embodiment.

In the present exemplary embodiment, while the description has been given of the case where the present disclosure is applied to both the LR verify operation and the HR verify operation, the present disclosure may be applied to just one of the LR verify operation and the HR verify operation. For example, the present disclosure is applied to just an LR verify operation where timing generation is difficult because of a short period between time point t1 and time point t2 if PMOS transistors 1303, 1304 operate as precharge transistors. On the other hand, in an HR verify operation, PMOS transistors 1303, 1304 operate as precharge transistors as in a readout operation. This realizes a further reduction in the steady-state memory cell current and reference current that are required in operation as precharge transistors than in the steady-state memory cell current and reference current that are required in operation as mirror transistors, and therefore current consumption can be reduced.

Further, although switch circuit 1311 is provided between gate pg and BL_REF, switch circuit 1311 may be provided between gate pg and BL_DAT.

Still further, PMOS transistors 1303, 1304 may be NMOS transistors. In this case, by changing control circuit 1312, the effect similar to that described in the present exemplary embodiment can be exhibited.

Fifth Exemplary Embodiment

Figure 26:
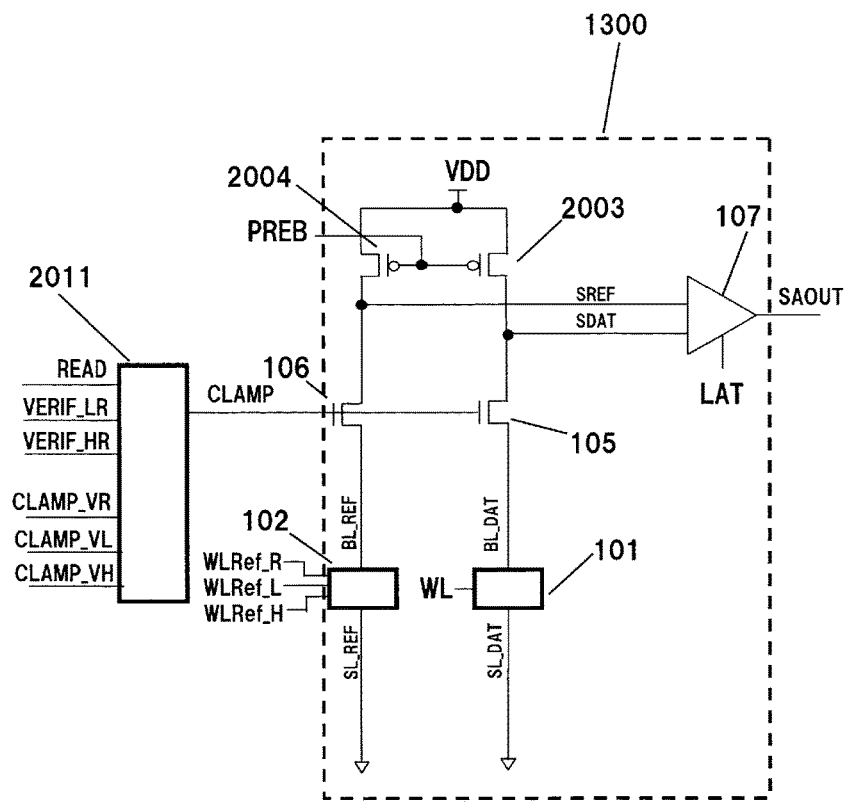
FIG. 26 is a circuit diagram of a nonvolatile semiconductor storage apparatus according to a fifth exemplary embodiment of the present disclosure.
Figure 27:
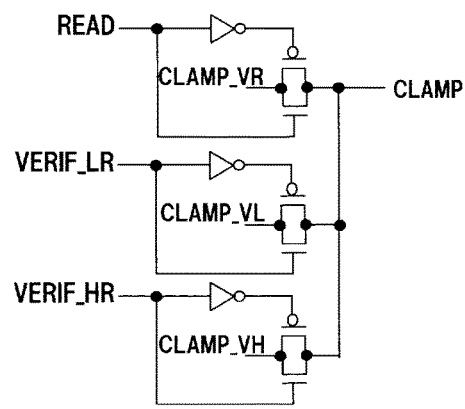
FIG. 27 is a circuit diagram of a clamp voltage switching circuit according to the fifth exemplary embodiment of the present disclosure.

FIGS. 26 to 27 show the structure of a fifth exemplary embodiment of the present disclosure. FIG. 26 is a circuit diagram of a nonvolatile semiconductor storage apparatus according to the fifth exemplary embodiment of the present disclosure. Reference character 101 denotes a memory cell (variable resistance nonvolatile memory cell). While FIG. 26 shows the case where single memory cell 101 is disposed for the sake of simplicity, the operation described below holds true for the case where a plurality of memory cells are disposed.

Reference character 102 denotes a reference cell. Reference characters 2003 and 2004 denote P-type metal-oxide-semiconductor (PMOS) transistors that precharge data node SDAT being a determining node and reference node SREF. Reference characters 105 and 106 denote clamp transistors that control the voltage of bit line BL_DAT and reference bit line BL_REF to a certain voltage. Reference character 107 denotes a determining circuit including an amplifier that amplifies the voltage difference between SDAT and SREF to a logic level and performs latching. Reference character 2011 denotes a clamp voltage switching circuit that selectively outputs CLAMP voltage in response to READ, VERIF_LR, VERIF_HR signals.

Memory cell 101, reference cell 102, determining circuit 107, and equalizer circuit 108 have the structure similar to that described in the first exemplary embodiment.

FIG. 27 is a circuit diagram showing the clamp voltage switching circuit according to the fifth exemplary embodiment of the present disclosure. FIG. 27 shows the structure of clamp voltage switching circuit 2011. Clamp voltage switching circuit 2011 selectively outputs clamp voltages VCLAMP_VH, VCLAMP_VR, VCLAMP_VL in response to READ, VERIF_LR, VERIF_HR signals. The voltages satisfy the relationship: VCLAMP_VH>VCLAMP_VR>VCLAMP_VL.

As one mode of the nonvolatile semiconductor storage apparatus of the present disclosure, the signal input to a clamp voltage switching circuit may be connected to a terminal of one of at least two resistors connected in series.

Figure 28:
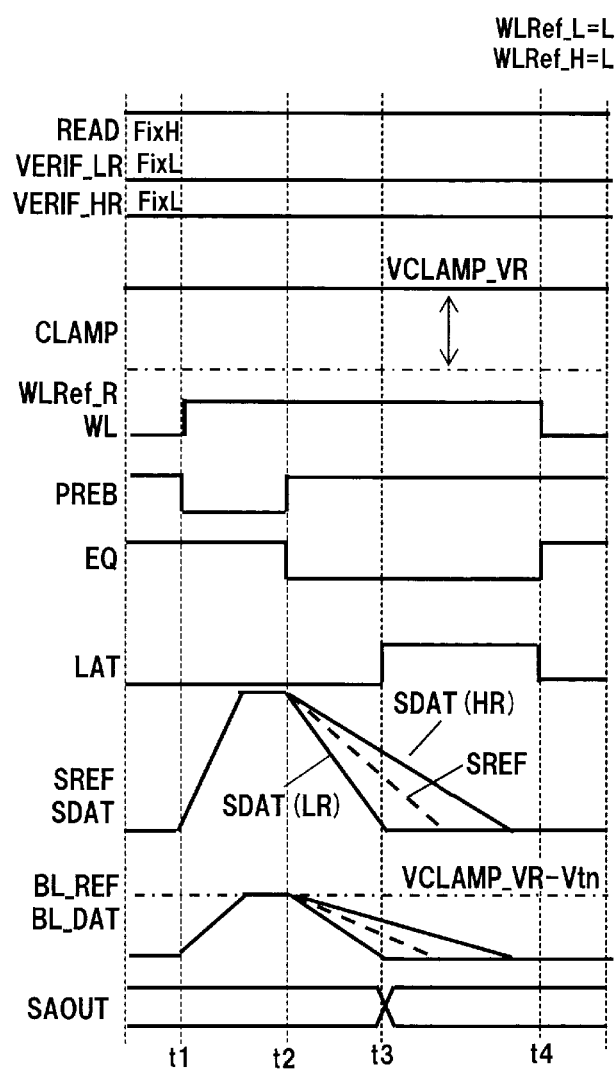
FIG. 28 is a chart showing readout operation waveforms using the nonvolatile semiconductor storage apparatus according to the fifth and sixth exemplary embodiments of the present disclosure.

Next, a description will be given of a readout operation. FIG. 28 is a chart showing readout operation waveforms using the nonvolatile semiconductor storage apparatus according to the fifth and sixth exemplary embodiments of the present disclosure. READ is set to 'H' level, VERIF_LR is set to 'L' level, and VERIF_HR is set to 'L' level. CLAMP voltage is set to a certain voltage (VCLAMP_VR). Further, WLRef_L, WLRef_H are set to non-selection level.

At time point t1, WLRef_R and WL are caused to transit to selection level and PREB is set to 'L' level, whereby SDAT, SREF, BL_DAT, BL_REF start to be precharged.

At time point t2, PREB is set to 'H' level, whereby the precharging is stopped. At this time, SDAT, SREF are substantially at VDD level, and BL_DAT, BL_REF are at VCLAMP_VR−Vtn level where Vtn is the threshold voltage of clamp transistors 105, 106.

In a period from time point t2 to time point t3, SDAT, SREF and BL_DAT, BL_REF are discharged through memory cell 101 and reference cell 102.

When the memory cell is in the low resistance state (LR), SDAT voltage reduces faster than SREF voltage.

When the memory cell is in the high resistance state (HR), SDAT voltage reduces slower than SREF voltage.

Time point t3 is set to the timing at which the voltage difference between SDAT and SREF becomes greater than the amplification limit voltage of the amplifier of determining circuit 107. At time point t3, LAT is set to 'H' level, whereby the amplifier is activated and data is output to SAOUT.

At time point t4, WL, WLRef_R are set to non-selection level, and LAT is set to 'L' level, whereby the amplifier is stopped.

Figure 29:
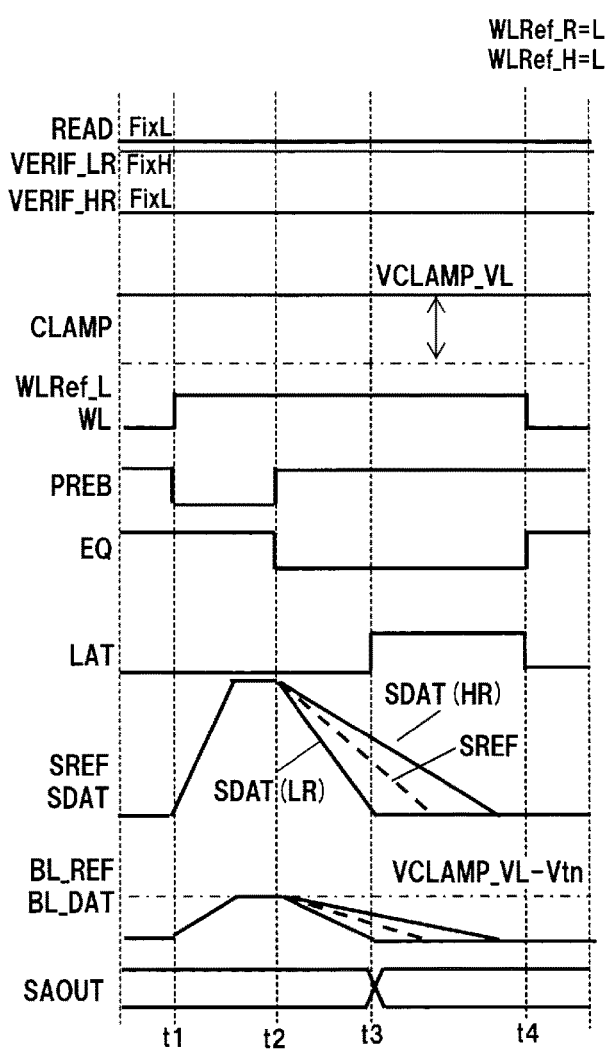
FIG. 29 is a chart showing LR verify operation waveforms using the nonvolatile semiconductor storage apparatus according to the fifth and sixth exemplary embodiments of the present disclosure.

Next, a description will be given of an LR verify operation. FIG. 29 is a chart showing LR verify operation waveforms using the nonvolatile semiconductor storage apparatus according to the fifth and sixth exemplary embodiments of the present disclosure. READ is set to 'L' level, VERIF_LR is set to 'H' level, and VERIF_HR is set to 'L' level. CLAMP voltage is set to a certain voltage (VCLAMP_VL). Further, WLRef_R, WLRef_H are set to non-selection level.

At time point t1, WLRef_L and WL are caused to transit to selection level and PREB is set to 'L' level, whereby SDAT, SREF, BL_DAT, BL_REF start to be precharged.

At time point t2, PREB is set to 'H' level, whereby the precharging is stopped. At this time, SDAT, SREF are substantially at VDD level, and BL_DAT, BL_REF are at VCLAMP_VL−Vtn level where Vtn is the threshold voltage of clamp transistors 105, 106.

In a period from time point t2 to time point t3, SDAT, SREF and BL_DAT, BL_REF are discharged through memory cell 101 and reference cell 102.

When the memory cell is in the low resistance state (LR), SDAT voltage reduces faster than SREF voltage.

When the memory cell is in the high resistance state (HR), SDAT voltage reduces slower than SREF voltage.

At this time, the voltage of VCLAMP_VL is adjusted such that the reduction speed of SREF becomes substantially identical to that of SREF in a readout operation. Accordingly, the timing of time point t3 can be set to be identical to that in a readout operation.

At time point t3, LAT is set to 'H' level, whereby the amplifier is activated and data is output to SAOUT.

At time point t4, WL, WL_Ref L are set to non-selection level, and LAT is set to 'L' level, whereby the amplifier is stopped.

Figure 30:
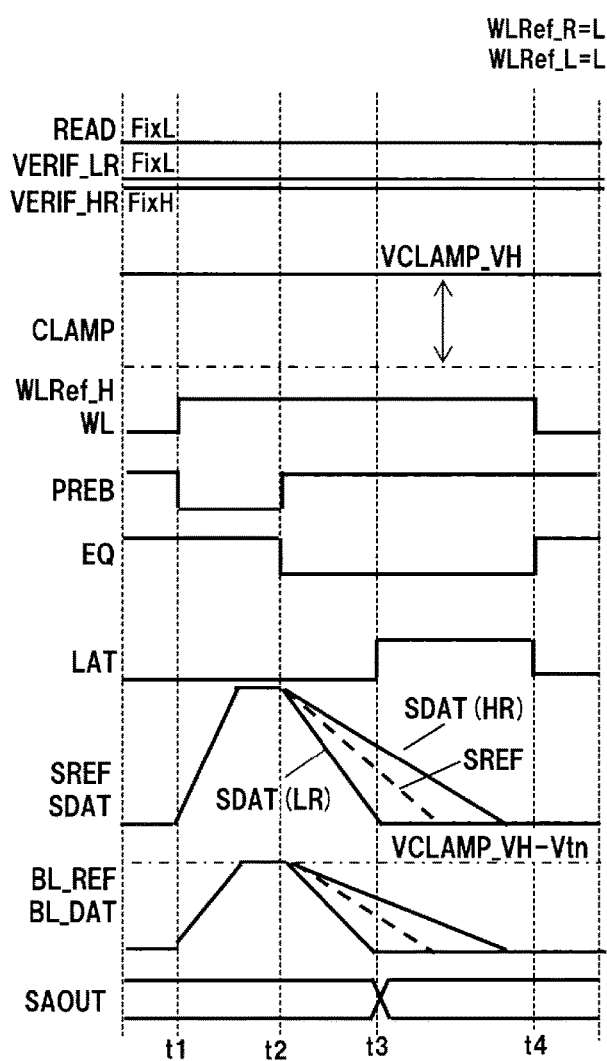
FIG. 30 is a chart showing HR verify operation waveforms using the nonvolatile semiconductor storage apparatus according to the fifth and sixth exemplary embodiments of the present disclosure.

Next, a description will be given of an HR verify operation. FIG. 30 is a chart showing HR verify operation waveforms using the nonvolatile semiconductor storage apparatus according to the fifth and sixth exemplary embodiments of the present disclosure. READ is set to 'L' level, VERIF_LR is set to 'L' level, and VERIF_HR is set to 'H' level. CLAMP voltage is set to a certain voltage (VCLAMP_VH). Further, WLRef_R, WLRef_L are set to non-selection level.

At time point t1, WLRef_H and WL are caused to transit to selection level and PREB is set to 'L' level, whereby SDAT, SREF, BL_DAT, BL_REF start to be precharged.

At time point t2, PREB is set to 'H' level, whereby the precharging is stopped. At this time, SDAT, SREF are substantially at VDD level, and BL_DAT, BL_REF are at VCLAMP_VH−Vtn level where Vtn is the threshold voltage of clamp transistors 105, 106.

In a period from time point t2 to time point t3, SDAT, SREF and BL_DAT, BL_REF are discharged through memory cell 101 and reference cell 102.

When the memory cell is in the low resistance state (LR), SDAT voltage reduces faster than SREF voltage.

When the memory cell is in the high resistance state (HR), SDAT voltage reduces slower than SREF voltage.

At this time, the voltage of VCLAMP_VH is adjusted such that the reduction speed of SREF becomes substantially identical to that of SREF in a readout operation. Accordingly, the timing of time point t3 can be set to be identical to that in a readout operation.

At time point t3, LAT is set to 'H' level, whereby the amplifier is activated and data is output to SAOUT.

At time point t4, WL, WLRef_H are set to non-selection level, and LAT is set to 'L' level, whereby the amplifier is stopped.

In the present exemplary embodiment, while the description has been given of the case where the present disclosure is applied to both the LR verify operation and the HR verify operation, the present disclosure may be applied to just one of the LR verify operation and the HR verify operation. For example, the present disclosure is applied to just an LR verify operation where timing generation is difficult with the conventional structure because of a short period between time point t2 and time point t3. Avoiding application of the present disclosure to an HR verify operation where high voltage needs to be set to BL_DAT, BL_REF and current consumption rises, the effect of reducing the current consumption in the verify operation can be exhibited.

One mode of the nonvolatile semiconductor storage apparatus of the present disclosure may include: a memory cell that includes at least a first terminal and a second terminal; a reference cell that includes at least a third terminal and a fourth terminal; and a readout circuit that is connected to a data node and a reference node. Further, the data node and a first transistor may be connected to each other, and the reference node and a second transistor may be connected to each other. The nonvolatile semiconductor storage apparatus may further include a first circuit that controls, based on an input signal, a voltage between the first terminal and the second terminal and a voltage between the third terminal and the fourth terminal. Further, the second terminal and the fourth terminal may be connected to a second power supply. The first circuit may be: an N-type metal-oxide-semiconductor (NMOS) transistor that has a source connected to the first terminal and has a drain connected to the data node; an NMOS transistor that has a source connected to the third terminal and has a drain connected to the reference node; a PMOS transistor that has a source connected to the second power supply and has a drain connected to the data node; and a PMOS transistor that has a source connected to the second power supply and has a drain connected to the reference node. Further, the voltage controlled by the first circuit may differ between a normal readout operation and a verifying operation being a completion determining operation in a rewrite operation of the nonvolatile memory cell. Further, the memory cell may be a variable resistance nonvolatile memory cell. A reduced resistance verifying operation and an increased resistance verifying operation may be performed as the verify operation, the reduced resistance verifying operation being a readout operation of verifying a resistance value after a resistance reducing operation, the increased resistance verifying operation being a readout operation of verifying a high resistance state after a resistance increasing operation. The voltage controlled by the first circuit may differ between the reduced resistance verifying operation and the increased resistance verifying operation.

Sixth Exemplary Embodiment

Figure 31:
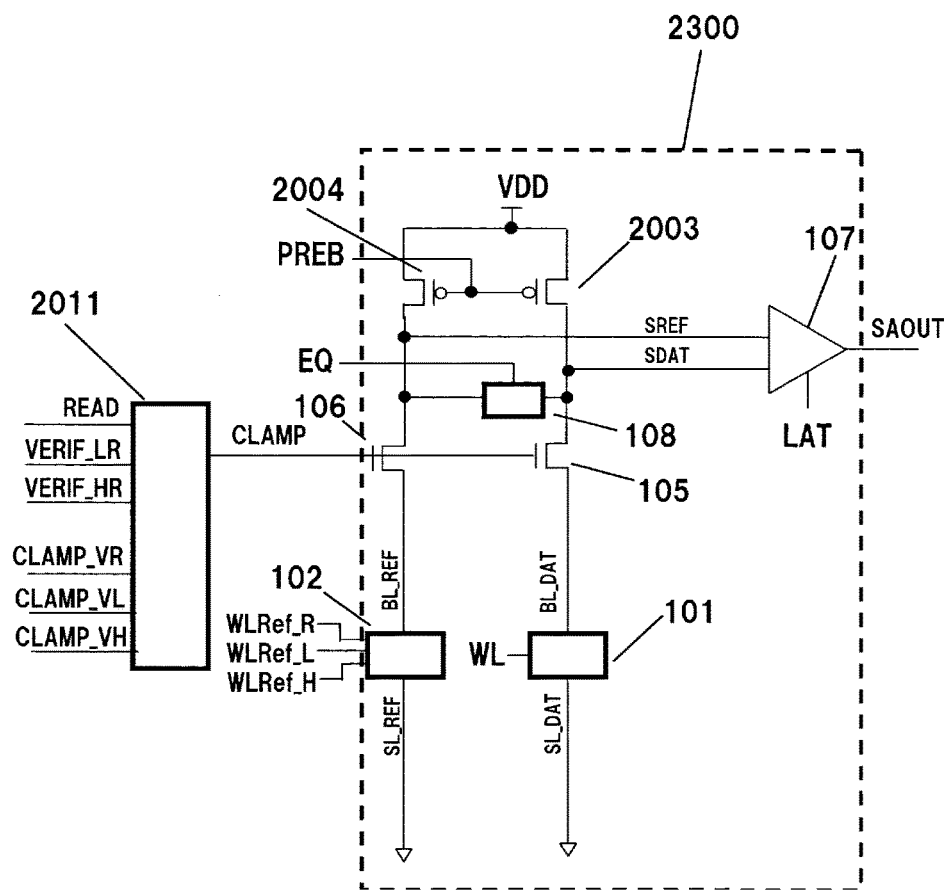
FIG. 31 is a circuit diagram of the nonvolatile semiconductor storage apparatus according to the sixth exemplary embodiment of the present disclosure.

FIG. 31 shows the structure of a sixth exemplary embodiment of the present disclosure. FIG. 31 is a circuit diagram of a nonvolatile semiconductor storage apparatus according to the sixth exemplary embodiment of the present disclosure. Reference character 2300 denotes a readout unit of 1-bit data of the nonvolatile semiconductor storage apparatus, which is arranged by 16 pieces for 16-bit data, with control signals and the like connected in common among the readout units. Reference character 101 denotes a memory cell (variable resistance nonvolatile memory cell). While FIG. 31 shows the case where single memory cell 101 is disposed for the sake of simplicity, the operation described below holds true for the case where a plurality of memory cells are disposed.

Reference character 102 denotes a reference cell. Reference characters 2003 and 2004 denote P-type metal-oxide-semiconductor (PMOS) transistors that precharge data node SDAT being a determining node and reference node SREF. Reference characters 105 and 106 denote clamp transistors that control the voltage of bit line BL_DAT and reference bit line BL_REF to a certain voltage. Reference character 107 denotes a determining circuit including an amplifier that amplifies the voltage difference between SDAT and SREF to a logic level and performs latching. Reference character 2011 denotes a clamp voltage switching circuit that selectively outputs CLAMP voltage in response to READ, VERIF_LR, VERIF_HR signals. Reference character 108 denotes an equalizer circuit.

Memory cell 101, reference cell 102, determining circuit 107, and equalizer circuit 108 have the structure similar to that described in the second exemplary embodiment.

FIG. 27 shows the structure of clamp voltage switching circuit 2011. Clamp voltage switching circuit 2011 selectively outputs clamp voltages VCLAMP_VH, VCLAMP_VR, VCLAMP_VL in response to READ, VERIF_LR, VERIF_HR signals. The voltages satisfy the relationship:
VCLAMP_VH>VCLAMP_VR>VCLAMP_VL.

Next, a description will be given of a readout operation. FIG. 28 is a chart showing readout operation waveforms using the nonvolatile semiconductor storage apparatus according to the fifth and sixth exemplary embodiments of the present disclosure. READ is set to 'H' level, VERIF_LR is set to 'L' level, and VERIF_HR is set to 'L' level. CLAMP voltage is set to a certain voltage (CLAMP_VR). Further, WLRef_L, WLRef_H are set to non-selection level.

At time point t1, WLRef_R and WL are caused to transit to selection level and PREB is set to 'L' level, whereby SDAT, SREF, BL_DAT, BL_RED start to be precharged.

At time point t2, PREB is set to 'H' level and EQ is set to 'L' level, whereby the precharging and the equalizing are stopped. At this time, SDAT, SREF are substantially at VDD level, and BL_DAT, BL_REF are at VCLAMP_VR−Vtn level where Vtn is the threshold voltage of clamp transistors 105, 106.

In a period from time point t2 to time point t3, SDAT, SREF and BL_DAT, BL_REF are discharged through memory cell 101 and reference cell 102.

When the memory cell is in the low resistance state (LR), SDAT voltage reduces faster than SREF voltage.

When the memory cell is in the high resistance state (HR), SDAT voltage reduces slower than SREF voltage.

Time point t3 is set to the timing at which the voltage difference between SDAT and SREF becomes greater than the amplification limit voltage of the amplifier of determining circuit 107. At time point t3, LAT is set to 'H' level, whereby the amplifier is activated and data is output to SAOUT.

At time point t4, WL, WLRef_R are set to non-selection level, and EQ is set to 'H' level, whereby SREF, SDAT are equalized. LAT is set to 'L' level, whereby the amplifier is stopped.

Next, a description will be given of an LR verify operation. FIG. 29 is a chart showing LR verify operation waveforms using the nonvolatile semiconductor storage apparatus according to the fifth and sixth exemplary embodiments of the present disclosure. READ is set to 'L' level, VERIF_LR is set to 'H' level, and VERIF_HR is set to 'L' level. CLAMP voltage is set to a certain voltage (VCLAMP_VL). Further, WLRef_R, WLRef_H are set to non-selection level.

At time point t1, WLRef_L and WL are caused to transit to selection level and PREB is set to 'L' level, whereby SDAT, SREF, BL_DAT, BL_REF start to be precharged.

At time point t2, PREB is set to 'H' level and EQ is set to 'L' level, whereby the precharging and the equalizing are stopped. At this time, SDAT, SREF are substantially at VDD level, and BL_DAT, BL_REF are at VCLAMP_VL−Vtn level where Vtn is the threshold voltage of clamp transistors 105, 106.

In a period from time point t2 to time point t3, SDAT, SREF and BL_DAT, BL_REF are discharged through memory cell 101 and reference cell 102.

When the memory cell is in the low resistance state (LR), SDAT voltage reduces faster than SREF voltage.

When the memory cell is in the high resistance state (HR), SDAT voltage reduces slower than SREF voltage.

At this time, the voltage of VCLAMP_VL is adjusted such that the reduction speed of SREF becomes substantially identical to that of SREF in a readout operation. Accordingly, the timing of time point t3 can be set to be identical to that in a readout operation.

At time point t3, LAT is set to 'H' level, whereby the amplifier is activated and data is output to SAOUT.

At time point t4, WL, WL_Ref L are set to non-selection level, and EQ is set to 'H' level, whereby SREF, SDAT are equalized. LAT is set to 'L' level, whereby the amplifier is stopped.

Next, a description will be given of an HR verify operation. FIG. 30 is a chart showing HR verify operation waveforms using the nonvolatile semiconductor storage apparatus according to the fifth and sixth exemplary embodiments of the present disclosure. READ is set to 'L' level, VERIF_LR is set to 'L' level and VERIF_HR is set to 'H' level. CLAMP voltage is set to a certain voltage (VCLAMP_VH). Further, WLRef_R, WLRef_L are set to non-selection level.

At time point t1, WLRef_H and WL are caused to transit to selection level and PREB is set to 'L' level, whereby SDAT, SREF, BL_DAT, BL_REF start to be precharged.

At time point t2, PREB is set to 'H' level and EQ is set to 'L' level, whereby the precharging and the equalizing are stopped. At this time, SDAT, SREF are substantially at VDD level, and BL_DAT, BL_REF are at VCLAMP_VH−Vtn level where Vtn is the threshold voltage of clamp transistors 105, 106.

In a period from time point t2 to time point t3, SDAT, SREF and BL_DAT, BL_REF are discharged through memory cell 101 and reference cell 102.

When the memory cell is in the low resistance state (LR), SDAT voltage reduces faster than SREF voltage.

When the memory cell is in the high resistance state (HR), SDAT voltage reduces slower than SREF voltage.

At this time, the voltage of VCLAMP_VH is adjusted such that the reduction speed of SREF becomes substantially identical to that of SREF in a readout operation. Accordingly, the timing of time point t3 can be set to be identical to that in a readout operation.

At time point t3, LAT is set to 'H' level, whereby the amplifier is activated and data is output to SAOUT.

At time point t4, WL, WLRef_H are set to non-selection level and EQ is set to 'H' level, whereby SREF, SDAT are equalized. LAT is set to 'L' level, whereby the amplifier is stopped.

In the present exemplary embodiment, the discharge transistors and the equalizer circuit realize a faster operation than with the nonvolatile semiconductor storage apparatus according to the fifth exemplary embodiment.

In the present exemplary embodiment, while the description has been given of the case where the present disclosure is applied to both the LR verify operation and the HR verify operation, the present disclosure may be applied to just one of the LR verify operation and the HR verify operation. For example, the present disclosure is applied to just the LR verify operation where timing generation is difficult with the conventional structure because of a short period between time point t2 to time point t3. On the other hand, avoiding application of the present disclosure to the HR verify operation where high voltage needs to be set to BL_DAT, BL_REF and current consumption rises, the effect of reducing the current consumption in the verify operation can be exhibited.

Seventh Exemplary Embodiment

Figure 32:
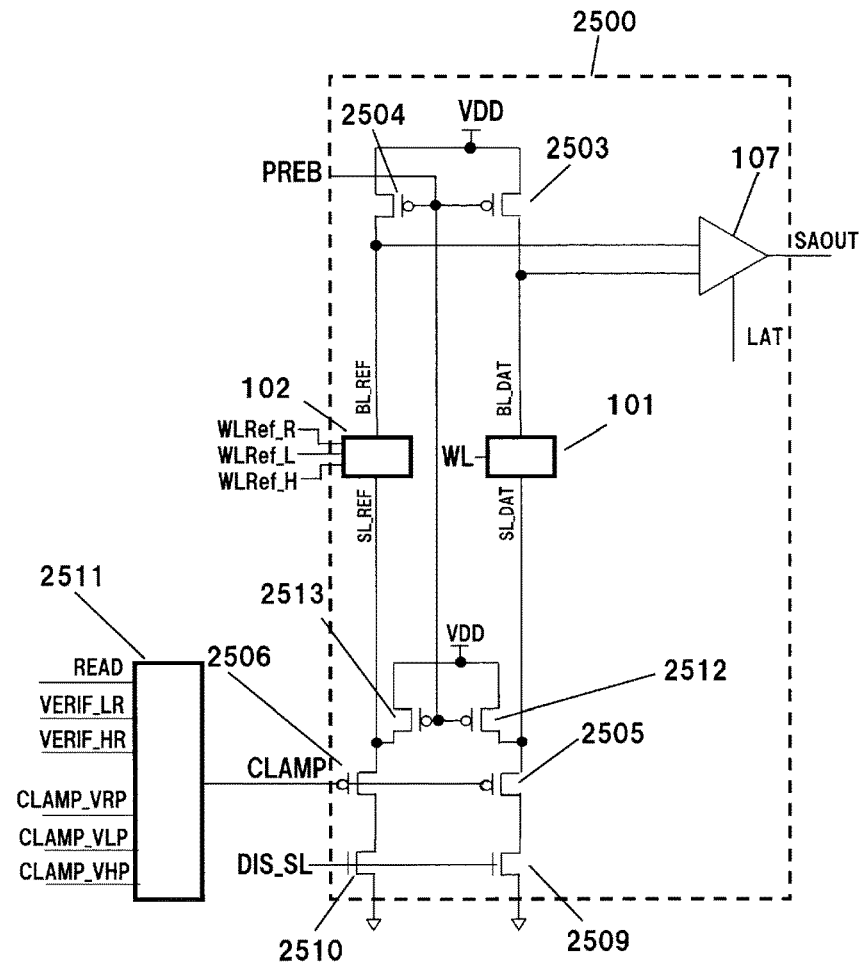
FIG. 32 is a circuit diagram of a nonvolatile semiconductor storage apparatus according to a seventh exemplary embodiment of the present disclosure.
Figure 33:
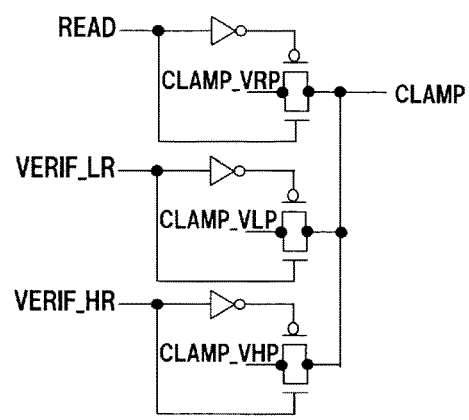
FIG. 33 is a circuit diagram of a clamp voltage switching circuit according to the seventh exemplary embodiment of the present disclosure.

FIGS. 32 and 33 show the structure of a seventh exemplary embodiment of the present disclosure. FIG. 32 is a circuit diagram of a nonvolatile semiconductor storage apparatus according to the seventh exemplary embodiment of the present disclosure. Reference character 2500 denotes a readout unit of 1-bit data of the nonvolatile semiconductor storage apparatus, which is arranged by 16 pieces for 16-bit data, with control signals and the like connected in common among the readout units. Reference character 101 denotes a memory cell (variable resistance nonvolatile memory cell). While FIG. 32 shows the case where single memory cell 101 is disposed for the sake of simplicity, the operation described below holds true for the case where a plurality of memory cells are disposed.

Reference character 102 denotes a reference cell. Reference characters 2503 and 2504 denote P-type metal-oxide-semiconductor (PMOS) transistors that precharge bit line BL_DAT being a determining node and reference bit line BL_REF. Reference characters 2512 and 2513 denote PMOS transistors that precharge source line SL_DAT and reference source line SL_REF. Reference characters 2505 and 2506 denote clamp transistors that control the voltage of source line SL_DAT and reference source line SL_REF to a certain voltage. Reference characters 2509 and 2510 denote N-type metal-oxide-semiconductor (NMOS) transistors that discharge source line SL_DAT and reference source line SL_REF. Reference character 107 denotes a determining circuit including an amplifier that amplifies the voltage difference between BL_DAT and BL_REF to a logic level and performs latching. Reference character 2511 denotes a clamp voltage switching circuit that selectively outputs CLAMP voltage in response to READ, VERIF_LR, VERIF_HR signals.

Memory cell 101, reference cell 102, and determining circuit 107 have the structure similar to that described in the first exemplary embodiment.

FIG. 33 is a circuit diagram of the clamp voltage switching circuit according to the seventh exemplary embodiment of the present disclosure. FIG. 33 shows the structure of clamp voltage switching circuit 2511. Clamp voltage switching circuit 2511 selectively outputs clamp voltages VCLAMP_VH, VCLAMP_VR, VCLAMP_VL in response to READ, VERIF_LR, VERIF_HR signals. The voltages satisfy the relationship: VCLAMP_VLP>VCLAMP_VRP>VCLAMP_VHP.

Figure 34:
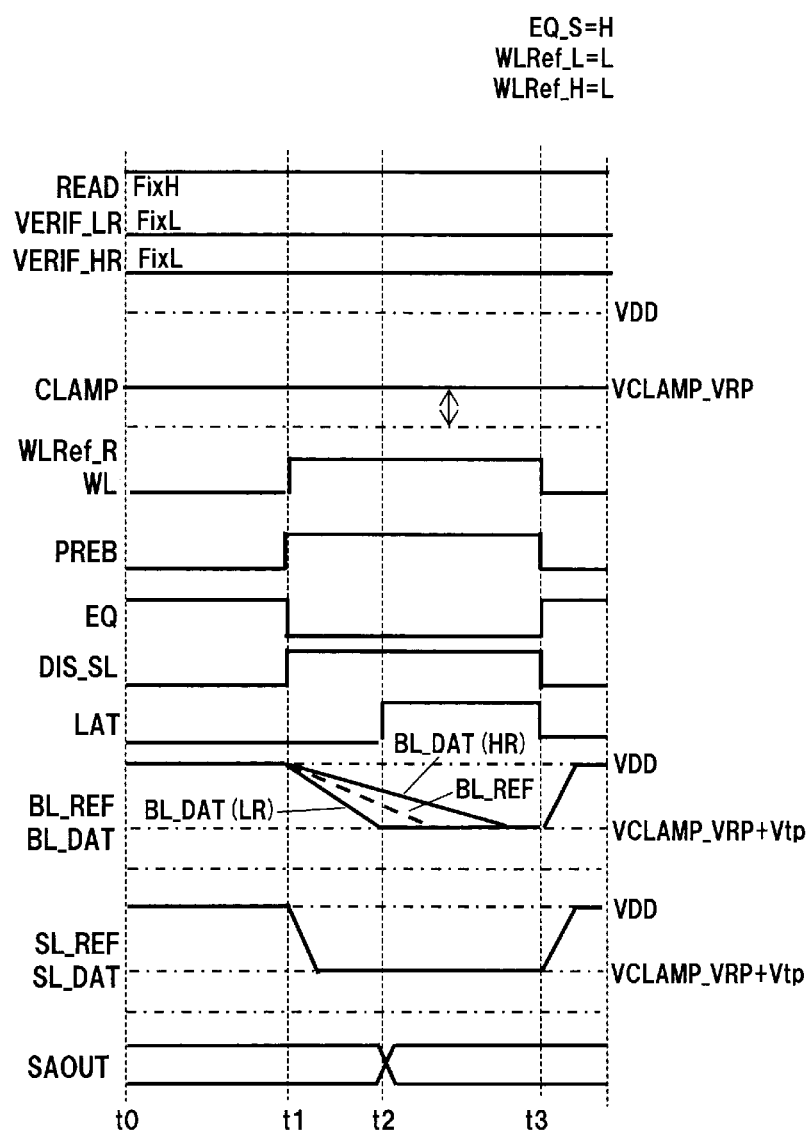
FIG. 34 is a chart showing readout operation waveforms using the nonvolatile semiconductor storage apparatus according to the seventh and eighth exemplary embodiments of the present disclosure.

Next, a description will be given of a readout operation. FIG. 34 is a chart showing readout operation waveforms using the nonvolatile semiconductor storage apparatus according to the seventh and eighth exemplary embodiments of the present disclosure. READ is set to 'H' level, VERIF_LR is set to 'L' level, and VERIF_HR is set to 'L' level. CLAMP voltage is set to a certain voltage (CLAMP_VRP). Further, WLRef_L, WLRef_H are set to non-selection level.

At time point t0, since PREB is set to 'L' level, BL_DAT, BL_REF, SL_DAT, SL_REF are precharged to VDD.

At time point t1, WLRef_R and WL are caused to transit to selection level and PREB is set to 'H' level, whereby the precharging is stopped. DIS_SL is set to 'H' level. In a period from time point t1 to time point t2, the absolute value of the threshold voltage of clamp transistors 2505, 2506 is Vtp. SL_REF, SL_DAT transit to CLAMP_VRP+Vtp level, and BL_DAT, BL_REF are discharged through memory cell 101 and reference cell 102.

When the memory cell is in the low resistance state (LR), BL_DAT voltage reduces faster than BL_REF voltage.

When the memory cell is in the high resistance state (HR), BL_DAT voltage reduces slower than BL_REF voltage.

Time point t2 is set to the timing at which the voltage difference between BL_DAT and BL_REF becomes greater than the amplification limit voltage of the amplifier of determining circuit 107. At time point t2, LAT is set to 'H' level, whereby the amplifier is activated and data is output to SAOUT.

At time point t3, WL, WLRef_R are set to non-selection level, and PREB is set to 'L' level, whereby BL_DAT, BL_REF, SL_DAT, SL_REF are precharged. LAT is set to 'L' level, whereby the amplifier is stopped.

Figure 35:
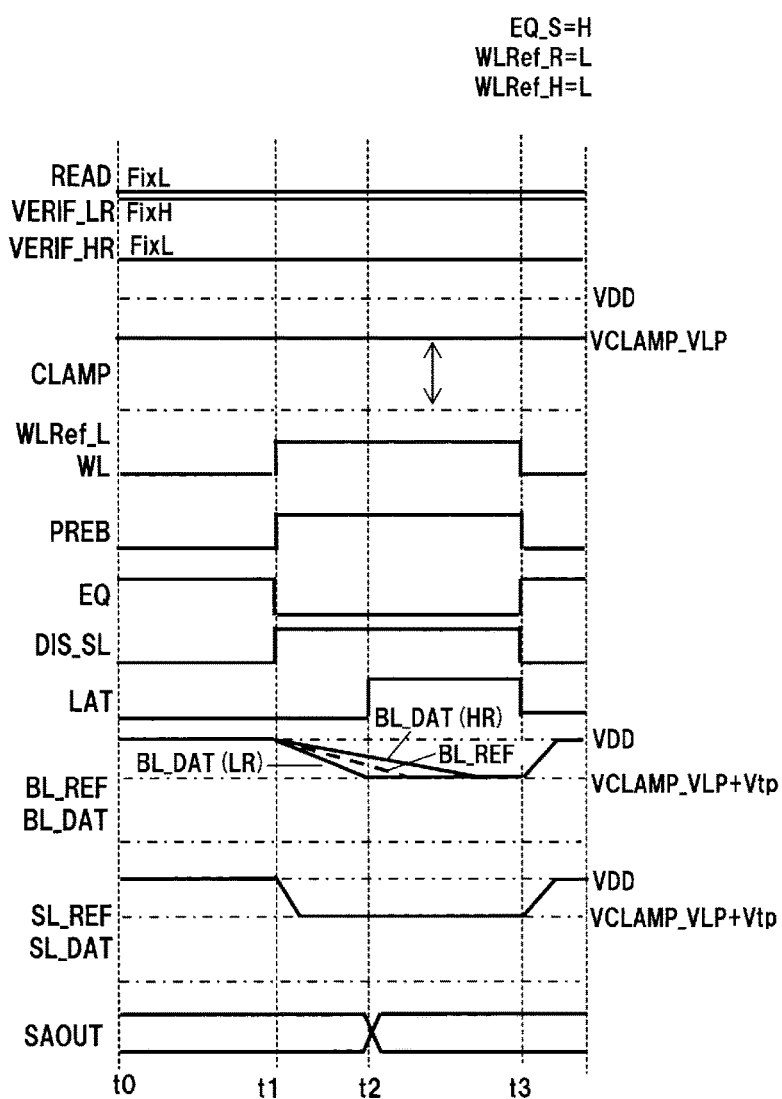
FIG. 35 is a chart showing LR verify operation waveforms using the nonvolatile semiconductor storage apparatus according to the seventh and eighth exemplary embodiments of the present disclosure.

Next, a description will be given of an LR verify operation. FIG. 35 is a chart showing LR verify operation waveforms using nonvolatile semiconductor storage apparatus according to the seventh and eighth exemplary embodiments of the present disclosure. READ is set to 'L' level, VERIF_LR is set to 'H' level, and VERIF_HR is set to 'L' level. CLAMP voltage is set to a certain voltage (CLAMP_VLP). Further, WLRef_R, WLRef_H are set to non-selection level.

At time point t0, since PREB is set to 'L' level, BL_DAT, BL_REF, SL_DAT, SL_REF are precharged to VDD.

At time point t1, WLRef_L and WL are caused to transit to selection level and PREB is set to 'H' level, whereby the precharging is stopped. DIS_SL is set to 'H' level.

In a period from time point t1 to time point t2, the absolute value of the threshold voltage of clamp transistors 2505, 2506 is Vtp. SL_REF, SL_DAT transit to CLAMP_VLP+Vtp level, and BL_DAT, BL_REF are discharged through memory cell 101 and reference cell 102.

When the memory cell is in the low resistance state (LR), BL_DAT voltage reduces faster than BL_REF voltage.

When the memory cell is in the high resistance state (HR), BL_DAT voltage reduces slower than BL_REF voltage.

At this time, the voltage of CLAMP_VLP is adjusted such that the reduction speed of BL_REF becomes substantially identical to that of BL_REF voltage in a readout operation. Accordingly, the timing of time point t2 can be set to be identical to that in a readout operation.

At time point t2, LAT is set to 'H' level, whereby the amplifier is activated and data is output to SAOUT.

At time point t3, WL, WLRef_L are set to non-selection level and PREB is set to 'L' level, whereby BL_DAT, BL_REF, SL_DAT, SL_REF are precharged. LAT is set to 'L' level, whereby the amplifier is stopped.

Figure 36:
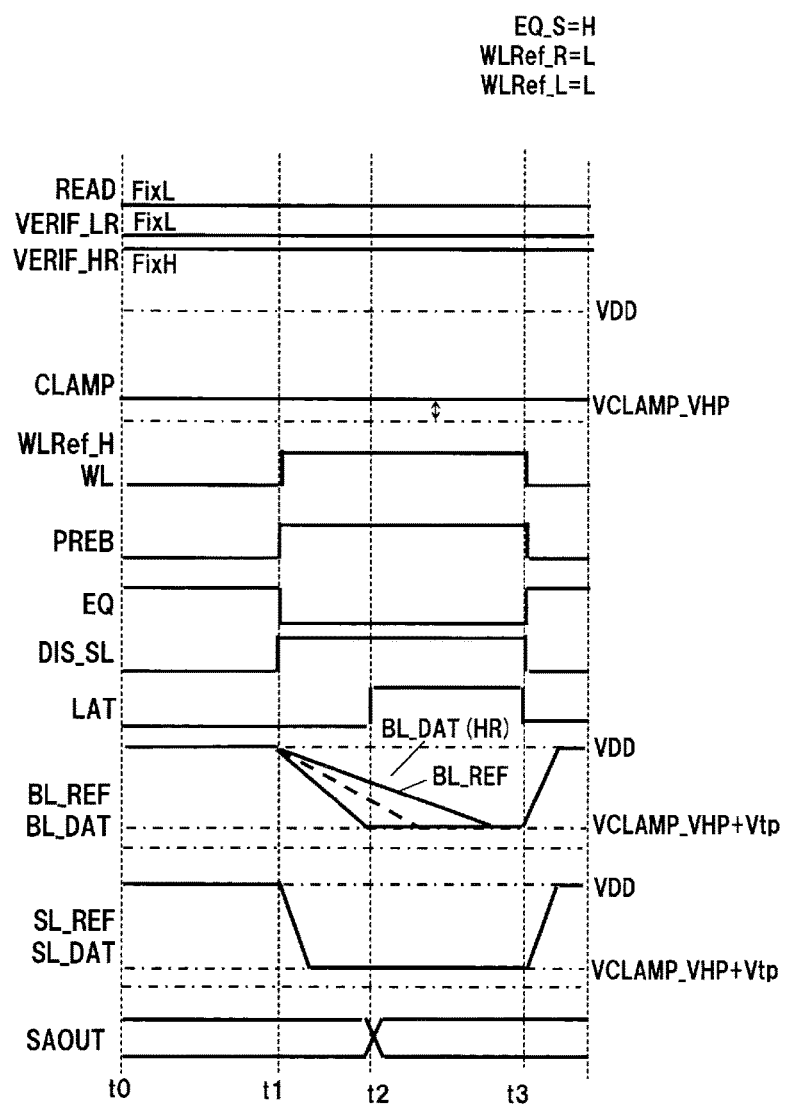
FIG. 36 is a chart showing HR verify operation waveforms using the nonvolatile semiconductor storage apparatus according to the seventh and eighth exemplary embodiments of the present disclosure.

Next, a description will be given of an HR verify operation. FIG. 36 is a chart showing HR verify operation waveforms using the nonvolatile semiconductor storage apparatus according to the seventh and eighth exemplary embodiments of the present disclosure. READ is set to 'L' level, VERIF_LR is set to 'L' level, and VERIF_HR is set to 'H' level. CLAMP voltage is set to a certain voltage (CLAMP_VHP). Further, WLRef_R, WLRef_L are set to non-selection level.

At time point to, since PREB is set to 'L' level, BL_DAT, BL_REF, SL_DAT, SL_REF are precharged to VDD.

At time point t1, WLRef_L and WL are caused to transit to selection level and PREB is set to 'H' level, whereby the precharging and the equalizing are stopped. DIS_SL is set to 'H' level.

In a period from time point t1 to time point t2, the threshold voltage of clamp transistors 2905, 2906 is Vtp. SL_REF, SL_DAT transit to CLAMP_VHP+Vtp level, and BL_DAT, BL_REF are discharged through memory cell 101 and reference cell 102.

When the memory cell is in the low resistance state (LR), BL_DAT voltage reduces faster than BL_REF voltage.

When the memory cell is in the high resistance state (HR), BL_DAT voltage reduces slower than BL_REF voltage.

At this time, the voltage of CLAMP_VHP is adjusted such that the reduction speed of BL_REF becomes substantially identical to that of BL_REF voltage in a readout operation. Accordingly, the timing of time point t2 can be set to be identical to that in a readout operation.

At time point t2, LAT is set to 'H' level, whereby the amplifier is activated and data is output to SAOUT.

At time point t3, WL, WLRef_H are set to non-selection level, and PREB is set to 'L' level, whereby BL_DAT, BL_REF, SL_DAT, SL_REF are precharged. LAT is set to 'L' level, whereby the amplifier is stopped.

As one mode of the nonvolatile semiconductor storage apparatus of the present disclosure, the control circuit may be structured as follows. In the nonvolatile semiconductor storage apparatus, the second terminal and the fourth terminal may be connected to a second power supply. The first circuit may be: a PMOS transistor that has a drain connected to the first terminal and a source connected to a third power supply; a PMOS transistor that has a drain connected to the third terminal and has a source connected to a third voltage; a PMOS transistor that has a source connected to the third voltage and has a drain connected to the data node; and a PMOS transistor that has a source connected to the third voltage and has a drain connected to the reference node.

Eighth Exemplary Embodiment

Figure 37:
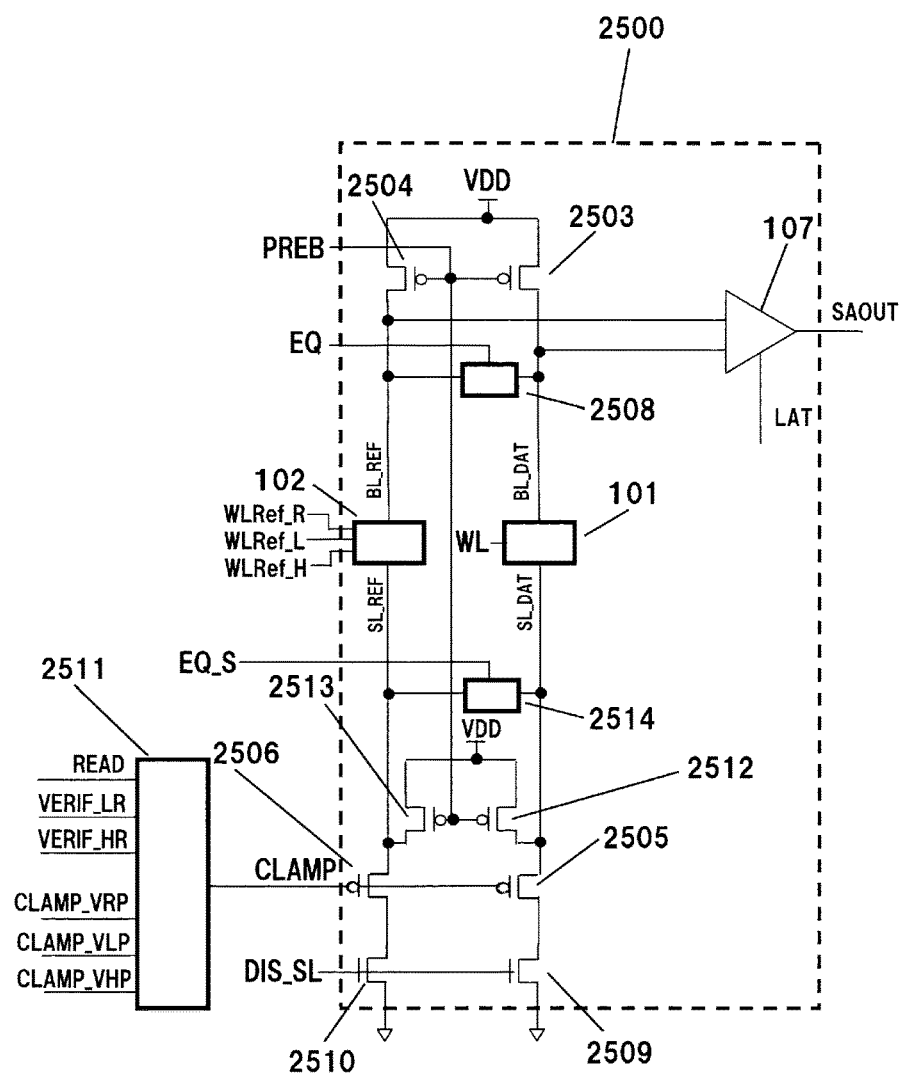
FIG. 37 is a circuit diagram of the nonvolatile semiconductor storage apparatus according to the eighth exemplary embodiment of the present disclosure.
Figure 38:
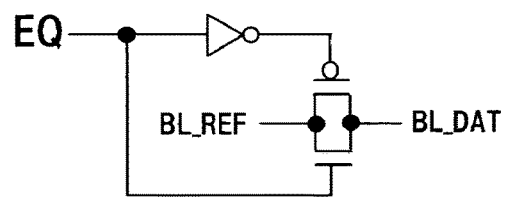
FIG. 38 is a circuit diagram of an equalizer circuit according to the eighth exemplary embodiment of the present disclosure.
Figure 39:
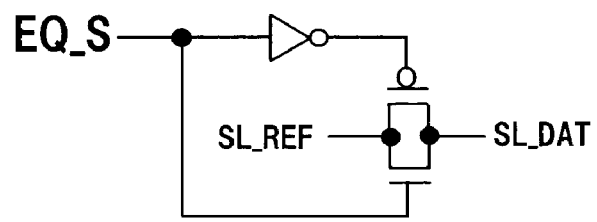
FIG. 39 is a circuit diagram of the equalizer circuit according to the eighth exemplary embodiment of the present disclosure.

FIGS. 37 to 39 show the structure of an eighth exemplary embodiment of the present disclosure. FIG. 37 is a circuit diagram of a nonvolatile semiconductor storage apparatus according to the eighth exemplary embodiment of the present disclosure. Reference character 2500 denotes a readout unit of 1-bit data of the nonvolatile semiconductor storage apparatus, which is arranged by 16 pieces for 16-bit data, with control signals and the like connected in common among the readout units. Reference character 101 denotes a memory cell (variable resistance nonvolatile memory cell). While FIG. 37 shows the case where single memory cell 101 is disposed for the sake of simplicity, the operation described below holds true for the case where a plurality of memory cells are disposed.

Reference character 102 denotes a reference cell. Reference characters 2503 and 2504 denote P-type metal-oxide-semiconductor (PMOS) transistors that precharge bit line BL_DAT being a determining node and reference bit line BL_REF. Reference characters 2512 and 2513 denote PMOS transistors that precharge source line SL_DAT and reference source line SL_REF. Reference characters 2505 and 2506 denote clamp transistors that control the voltage of source line SL_DAT and reference source line SL_REF to a certain voltage. Reference characters 2509 and 2510 denote N-type metal-oxide-semiconductor (NMOS) transistors that discharge source line SL_DAT and reference source line SL_REF. Reference character 107 denotes a determining circuit including an amplifier that amplifies the voltage difference between BL_DAT and BL_REF to a logic level and performs latching. Reference character 2511 denotes a clamp voltage switching circuit that selectively outputs CLAMP voltage in response to READ, VERIF_LR, VERIF_HR signals. Reference characters 2508 and 2514 denote equalizer circuits.

Memory cell 101, reference cell 102, and determining circuit 107 have the structure similar to that described in the first exemplary embodiment.

FIG. 38 is a circuit diagram of the equalizer circuit according to the eighth exemplary embodiment of the present disclosure. FIG. 38 shows the structure of equalizer circuit 2508. Equalizer circuit 2508 performs an operation of equalizing BL_DAT and BL_REF to an identical voltage or an operation of disconnecting BL_DAT and BL_REF in response to equalize signal EQ.

FIG. 39 is a circuit diagram of the equalizer circuit according to the eighth exemplary embodiment of the present disclosure. FIG. 39 shows the structure of equalizer circuit 2514. Equalizer circuit 2514 performs an operation of equalizing SL_DAT and SL_REF to an identical voltage or an operation of disconnecting SL_DAT and SL_REF in response to equalize signal EQ_S.

Next, FIG. 34 shows a readout operation. READ is set to 'H' level, VERIF_LR is set to 'L' level, and VERIF_HR is set to 'L' level. CLAMP voltage is set to a certain voltage (CLAMP_VRP). Further, EQ, EQ_S are set to 'H' level, and WLRef_L, WLRef_H are set to non-selection level.

At time point to, since PREB is set to 'L' level, and EQ is set to 'H' level, BL_DAT, BL_REF, SL_DAT, SL_REF are precharged to VDD.

At time point t1, WLRef_R and WL are caused to transit to selection level, and PREB is set to 'H' level and EQ is set to 'L' level, whereby the precharging and the equalizing are stopped. DIS_SL is set to 'H' level. EQ_S is maintained at 'H' level, and the equalizing of SL_DAT and SL_REF is not stopped.

In a period from time point t1 to time point t2, the threshold voltage of clamp transistors 2505, 2506 is Vtp. SL_REF, SL_DAT transit to CLAMP_VRP+Vtp level. Thus, BL_DAT, BL_REF are discharged through memory cell 101 and reference cell 102.

When the memory cell is in the low resistance state (LR), BL_DAT voltage reduces faster than BL_REF voltage.

When the memory cell is in the high resistance state (HR), BL_DAT voltage reduces slower than BL_REF voltage.

Time point t2 is set to the timing at which the voltage difference between BL_DAT and BL_REF becomes greater than the amplification limit voltage of the amplifier of determining circuit 107. At time point t2, LAT is set to 'H' level, whereby the amplifier is activated and data is output to SAOUT.

At time point t3, WL, WLRef_R are set to non-selection level, and PREB is set to 'L' level, EQ, EQ_S are set to 'H' level. Thus, BL_DAT, BL_REF, SL_DAT, SL_REF are precharged and equalized. LAT is set to 'L' level, whereby the amplifier is stopped.

Next, a description will be given of an LR verify operation. FIG. 35 is a chart showing LR verify operation waveforms using nonvolatile semiconductor storage apparatus according to the seventh and eighth exemplary embodiments of the present disclosure. READ is set to 'L' level, VERIF_LR is set to 'H' level, and VERIF_HR is set to 'L' level. CLAMP voltage is set to a certain voltage (CLAMP_VLP). Further, EQ, EQ_S are set to 'H' level, and WLRef_R, WLRef_H are set to non-selection level.

At time point to, since PREB is set to 'L' level and EQ is set to 'H' level, BL_DAT, BL_REF, SL_DAT, SL_REF are precharged to VDD.

At time point t1, WLRef_L and WL are caused to transit to selection level, and PREB is set to 'H' level and EQ, EQ_S are set to 'L' level. Thus, the precharging and the equalizing are stopped. DIS_SL is set to 'H' level. EQ_S is maintained at 'H' level, and the equalizing of SL_DAT and SL_REF is not stopped.

In a period from time point t1 to time point t2, the threshold voltage of clamp transistors 2505, 2506 is Vtp. SL_REF, SL_DAT transit to CLAMP_VLP+Vtp level, and BL_DAT, BL_REF are discharged through memory cell 101 and reference cell 102.

When the memory cell is in the low resistance state (LR), BL_DAT voltage reduces faster than BL_REF voltage.

When the memory cell is in the high resistance state (HR), BL_DAT voltage reduces slower than BL_REF voltage.

At this time, the voltage of CLAMP_VLP is adjusted such that the reduction speed of BL_REF becomes substantially identical to that of BL_REF voltage in a readout operation. Accordingly, the timing of time point t2 can be set to be identical to that in a readout operation.

At time point t2, LAT is set to 'H' level, whereby the amplifier is activated and data is output to SAOUT.

At time point t3, WL, WLRef_L are set to non-selection level, PREB is set to 'L' level, and EQ, EQ_S are set to 'H' level. Thus, BL_DAT, BL_REF, SL_DAT, SL_REF are precharged and equalized. LAT is set to 'L' level, whereby the amplifier is stopped.

Next, a description will be given of an HR verify operation. FIG. 36 is a chart showing HR verify operation waveforms using the nonvolatile semiconductor storage apparatus according to the seventh and eighth exemplary embodiments of the present disclosure. READ is set to 'L' level, VERIF_LR is set to 'L' level, and VERIF_HR is set to 'H' level. CLAMP voltage is set to a certain voltage (CLAMP_VHP). Further, EQ, EQ_S are set to 'H' level, and WLRef_R, WLRef_L are set to non-selection level.

At time point to, since PREB is set to 'L' level and EQ, EQ_S are set to 'H' level, BL_DAT, BL_REF, SL_DAT, SL_REF are precharged to VDD.

At time point t1, WLRef_L and WL are caused to transit to selection level, and PREB is set to 'H' level and EQ is set to 'L' level. Thus, the precharging and the equalizing are stopped. DIS_SL is set to 'H' level. EQ, EQ_S are maintained at 'H' level, and the equalizing of SL_DAT and SL_REF is not stopped.

In a period from time point t1 to time point t2, the threshold voltage of clamp transistors 2905, 2906 is Vtp. SL_REF, SL_DAT transit to CLAMP_VHP+Vtp level, and BL_DAT, BL_REF are discharged through memory cell 101 and reference cell 102.

When the memory cell is in the low resistance state (LR), BL_DAT voltage reduces faster than BL_REF voltage.

When the memory cell is in the high resistance state (HR), BL_DAT voltage reduces slower than BL_REF voltage.

At this time, the voltage of CLAMP_VHP is adjusted such that the reduction speed of BL_REF becomes substantially identical to that of BL_REF voltage in a readout operation. Accordingly, the timing of time point t2 can be set to be identical to that in a readout operation.

At time point t2, the amplifier is activated and data is output to SAOUT.

At time point t3, WL, WLRef_H are set to non-selection level, and PREB is set to 'L' level, and EQ, EQ_S are set to 'H' level. Thus, BL_DAT, BL_REF, SL_DAT, SL_REF are precharged and equalized. LAT is set to 'L' level, whereby the amplifier is stopped.

In the present exemplary embodiment, the discharge transistors and the equalizer circuits realize a faster operation than with the nonvolatile semiconductor storage apparatus according to the seventh exemplary embodiment.

In the first to eighth exemplary embodiments, while the description has been given of the structure in which a variable resistance nonvolatile memory cell or resistance random access memory (ReRAM) is used as a memory cell, the present disclosure is applicable to a nonvolatile semiconductor storage apparatus that includes a readout circuit that determines data by detecting current flowing across the opposite ends of the memory cell. The present disclosure is also applicable to magnetoresistive random access memory (MRAM), phase change random access memory (PRAM), and flash memory.

Further, to single control circuit 112, one or more readout units 100 may be connected. As the number of readout units 100 connected to single control circuit 112 is greater, the number of control circuits 112 in the whole nonvolatile semiconductor storage apparatus can be reduced.

The nonvolatile semiconductor storage apparatus of the present disclosure is capable of realizing substantially uniform amplification timing even if an operation with a wide range of determination current is required as in the case where a verify operation is required in addition to a readout operation. Thus, both high speeds and determining precision of a readout operation are achieved. Accordingly, the present disclosure is useful as a memory that stores a data state by determining the amount of current passing through a memory cell in data determination.

What is claimed is:

1. A nonvolatile semiconductor storage apparatus comprising:
a memory cell that includes at least a first terminal and a second terminal;
a reference cell that includes at least a third terminal and a fourth terminal;
a readout circuit connected to the first terminal and the third terminal;
a first transistor connected to the first terminal; and
a second transistor connected to the third terminal,
wherein a gate of the first transistor and a gate of the second transistor are connected in common, the nonvolatile semiconductor storage apparatus further comprising a switch for electrically short-circuiting and disconnecting between the gates of the first and second transistors and a drain or a source of the second transistor, and
the switch electrically short-circuits and disconnects between the gates of the first and second transistors and a terminal of the readout circuit connected to the third terminal.

2. The nonvolatile semiconductor storage apparatus according to claim 1, further comprising a control circuit that has a first control terminal connected to the gate of the first transistor and has a second control terminal connected to the switch, the second control terminal for controlling short-circuiting and disconnecting of the switch, wherein the control circuit controls the first control terminal and the second control terminal.

3. The nonvolatile semiconductor storage apparatus according to claim 2, further comprising at least a plurality of the memory cells.

4. The nonvolatile semiconductor storage apparatus according to claim 2, wherein
the first transistor and the second transistor are P-type metal-oxide-semiconductor (PMOS) transistors,
in a first operation mode, the control circuit sets the first control terminal to energize the first and second transistors, sets the second control terminal to disconnect the switch, and causes the first transistor and the second transistor to operate as precharge transistors that respectively apply a first voltage to the first terminal and the third terminal, and
in a second operation mode, the control circuit sets the first control terminal to attain high impedance, sets the second control terminal to short-circuit the switch, and causes the first transistor and the second transistor to operate as mirror transistors that respectively apply the first voltage to the first terminal and the third terminal.

5. The nonvolatile semiconductor storage apparatus according to claim 4, wherein the first transistor and the second transistor are N-type metal-oxide-semiconductor (NMOS) transistors.

6. The nonvolatile semiconductor storage apparatus according to claim 4, wherein
the reference cell includes at least two resistors having one ends connected in parallel to the third terminal or the fourth terminal, and
other ends of the resistors are electrically connected to the fourth terminal when the one ends of the resistors are connected to the third terminal, or to the third terminal when the one ends of the resistors are connected to the fourth terminal, according to the first operation mode or the second operation mode.

7. A nonvolatile semiconductor storage apparatus comprising:
a memory cell;
a reference cell; and
a readout circuit that determines a data state based on a voltage difference resulting from a current difference between the memory cell and the reference cell to which voltage is applied,
wherein
a first transistor is connected to the memory cell and a second transistor is connected to the reference cell,
in a first operation mode, the first transistor and the second transistor operate as precharge transistors,
in a second operation mode, the first transistor and the second transistor operate as mirror transistors,
the nonvolatile semiconductor storage apparatus switches between the first operation mode and the second operation mode during operation
the memory cell is a variable resistance nonvolatile memory cell,
in a normal readout operation and in a rewrite operation, a reduced resistance verifying operation and an increased resistance verifying operation are performed, the reduced resistance verifying operation being a readout operation of verifying a resistance value after a resistance reducing operation, the increased resistance verifying operation being a readout operation of verifying a high resistance state after a resistance increasing operation,
in the first operation mode, the normal readout operation is performed, and
in the second operation mode, at least one of the increased resistance verifying operation and the reduced resistance verifying operation is performed.

8. A nonvolatile semiconductor storage apparatus comprising:
a memory cell that includes at least a first terminal and a second terminal,
a reference cell that includes at least a third terminal and a fourth terminal; and
a readout circuit that is connected to a data node and a reference node,
wherein the first terminal and a first transistor are connected to each other, and
the third terminal and a second transistor are connected to each other, the gates of the first transistor and the second transistor are connected in common, the nonvolatile semiconductor storage apparatus further comprising a first circuit that controls, voltage between the first terminal and the second terminal and voltage between the third terminal and the fourth terminal, the voltage between the first terminal and the second terminal and the voltage between the third terminal and the fourth terminal controlled by the first circuit during a normal readout operation differ from the respective voltages during a verifying operation, the verifying operation being a write completion operation of the nonvolatile memory cell, the memory cell is a variable resistance nonvolatile memory cell, each of a reduced resistance verifying operation and an increased resistance verifying operation is performed as a verifying operation, the reduced resistance verifying operation being a readout operation of verifying a resistance value after a resistance reducing operation, the increased resistance verifying operation being a readout operation of verifying a high resistance state after a resistance increasing operation, and the voltage between the first terminal and the second terminal and the voltage between the third terminal and the fourth terminal controlled by the first circuit differ respectively between the reduced resistance verifying operation and the increased resistance verifying operation.

9. A nonvolatile semiconductor storage apparatus comprising:
a memory cell that includes at least a first terminal and a second terminal;
a reference cell that includes at least a third terminal and a fourth terminal;
a readout circuit that is connected to a data node and a reference node;
a P-type metal-oxide-semiconductor (PMOS) transistor that has a source connected to a first power supply and has a drain connected to the data node;
a PMOS transistor that has a source connected to the first power supply and has a drain connected the reference node;
a first circuit that controls voltage between the first terminal and the second terminal and voltage between the third terminal and the fourth terminal; the first circuit comprising:
a first N-type metal-oxide-semiconductor (NMOS) transistor that has a source connected to the first terminal and has a drain connected to the data node; and
a second NMOS transistor that has a source connected to the third terminal and has a drain connected to the reference node; and
a clamp voltage switching circuit that controls a voltage of a gate of the first NMOS transistor and a voltage of a gate of the second NMOS transistor, wherein
the gate of the first NMOS transistor is connected to the gate of the second NMOS transistor, the second terminal and the fourth terminal are connected to a second power supply, and the voltage between the first terminal and the second terminal and the voltage between the third terminal and the fourth terminal controlled by the clamp voltage switching circuit during a normal readout operation differ from the respective voltages during a verifying operation, the verifying operation being a write completion operation of the nonvolatile memory cell.

10. The nonvolatile semiconductor storage apparatus according to claim 9, wherein an input signal to the clamp voltage switching circuit is connected to a terminal of one of at least two resistors connected in series.

11. A nonvolatile semiconductor storage apparatus comprising:
a memory cell that includes at least a first terminal and a second terminal;
a reference cell that includes at least a third terminal and a fourth terminal; and
a readout circuit that is connected to a data node and a reference node; wherein
the first terminal is connected to the data node and the third terminal is connected to the reference node;
a PMOS transistor that has a source connected to a first power supply and has a drain connected to a data node;
a PMOS transistor that has a source connected to a first power supply and has a drain connected to the reference node;
a first circuit that controls voltage between the first terminal and the second terminal and voltage between the third terminal and the fourth terminal, the first circuit comprising:
a first P-type metal-oxide-semiconductor (PMOS) transistor that has a source connected to the second terminal and has a drain connected to a second power supply;
a second PMOS transistor that has a source connected to the fourth terminal and has a drain connected to the second power supply; and
a clamp voltage switching circuit that controls a voltage of a gate of the first PMOS transistor and a voltage of a gate of the second PMOS transistor, wherein
the gates of the first PMOS transistor is connected to the gate of the second PMOS transistor, and
the voltage between the first terminal and the second terminal and the voltage between the third terminal and the fourth terminal controlled by the clamp voltage switching circuit during a normal readout operation differ from the respective voltages during a verifying operation, the verifying operation being a write completion operation of the nonvolatile memory cell.

12. The nonvolatile semiconductor storage apparatus according to claim 11, wherein an input signal to the clamp voltage switching circuit is connected to a terminal of one of at least two resistors connected in series.

* * * * *